(12) United States Patent
Soga et al.

(10) Patent No.: US 6,872,465 B2
(45) Date of Patent: *Mar. 29, 2005

(54) SOLDER

(75) Inventors: Tasao Soga, Hitachi (JP); Hanae Hata, Yokohama (JP); Tetsuya Nakatsuka, Yokohama (JP); Mikio Negishi, Komoro (JP); Hirokazu Nakajima, Saku (JP); Tsuneo Endoh, Komoro (JP)

(73) Assignee: Hitachi, Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/384,931

(22) Filed: Mar. 7, 2003

(65) Prior Publication Data

US 2003/0224197 A1 Dec. 4, 2003

(30) Foreign Application Priority Data

Mar. 8, 2002 (JP) ........................................ 2002-064251

(51) Int. Cl.[7] ........................... B32B 15/02; H01L 21/60
(52) U.S. Cl. ...................... 428/570; 428/646; 428/647; 428/648; 428/672; 428/675; 228/56.3
(58) Field of Search .................... 428/570, 646, 428/647, 648, 672, 675; 228/56.3

(56) References Cited

U.S. PATENT DOCUMENTS

| | | | |
|---|---|---|---|
| 5,520,752 A | | 5/1996 | Lucey, Jr. et al. |
| 6,235,996 B1 | | 5/2001 | Farooq et al. |
| 6,358,630 B1 | * | 3/2002 | Tsukada et al. ............. 428/646 |
| 6,486,551 B1 | * | 11/2002 | Sato et al. .................. 257/737 |
| 6,573,458 B1 | * | 6/2003 | Matsubara et al. ......... 174/260 |
| 2002/0100986 A1 | * | 8/2002 | Soga et al. ................. 257/779 |
| 2002/0114726 A1 | * | 8/2002 | Soga et al. ................. 420/557 |
| 2002/0171157 A1 | * | 11/2002 | Soga et al. ................. 257/783 |
| 2004/0007384 A1 | * | 1/2004 | Soga et al. ................. 174/260 |

FOREIGN PATENT DOCUMENTS

| | | | |
|---|---|---|---|
| JP | 02-142698 | * | 5/1990 |
| JP | 3-281093 | | 12/1991 |
| JP | 4-48770 | | 2/1992 |
| JP | 04-305394 | * | 10/1992 |
| JP | 4-371394 | | 12/1992 |
| JP | 7-235565 | | 9/1995 |
| JP | 08-164496 | * | 6/1996 |
| JP | 10-163270 | | 6/1998 |
| JP | 11-186712 | | 7/1999 |
| JP | 2000-49460 | | 2/2000 |
| JP | 2000-52027 | | 2/2000 |
| JP | 2000-116571 | | 4/2000 |
| JP | 2000-223831 | | 8/2000 |
| JP | 2000-246483 | | 9/2000 |
| JP | 2001-9587 | | 1/2001 |
| JP | 2001-205476 | | 7/2001 |
| WO | WO97/12718 | | 4/1997 |

* cited by examiner

*Primary Examiner*—John J. Zimmerman
(74) *Attorney, Agent, or Firm*—Townsend and Townsend and Crew LLP

(57) ABSTRACT

In a solder that realizes high-temperature-side solder bonding in temperature-hierarchical bonding, a connection portion between a semiconductor device and a substrate is formed of metal balls made of Cu or the like and compounds formed of metal balls and Sn, and the metal balls are bonded together by the compounds.

26 Claims, 21 Drawing Sheets

FIG.1
(a)
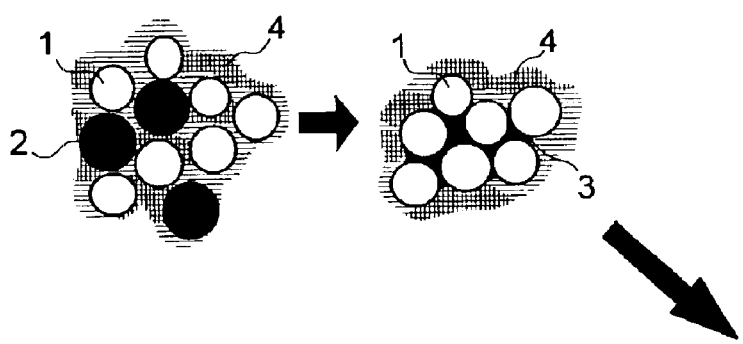
(b)
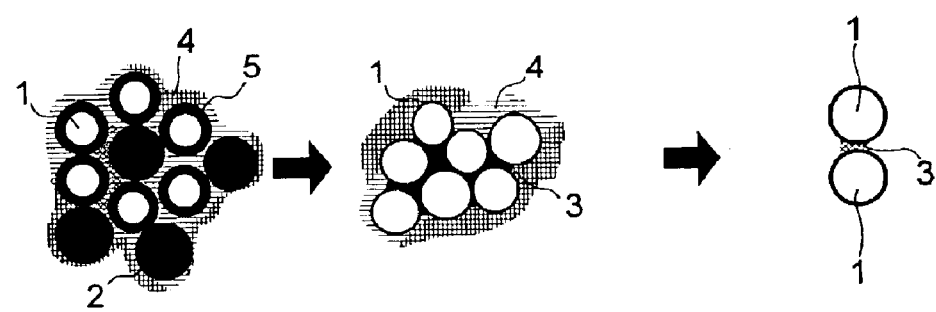
(c)
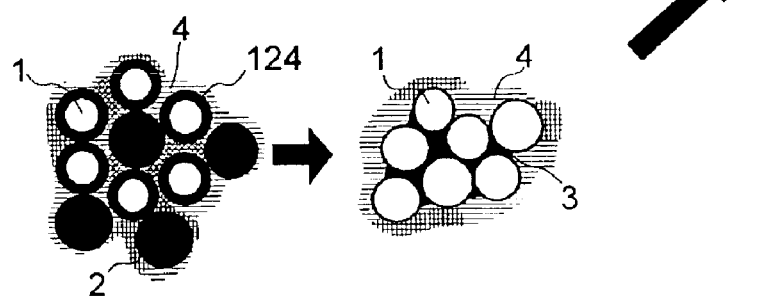

FIG.3
(a)
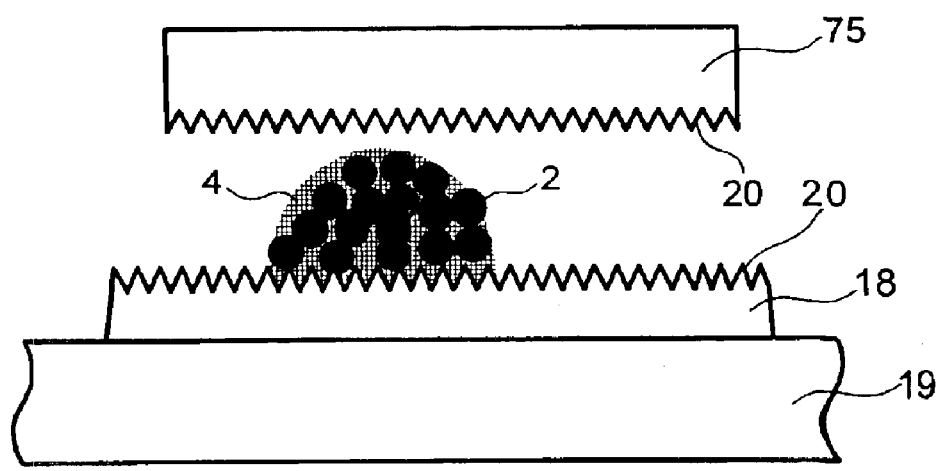
(b)
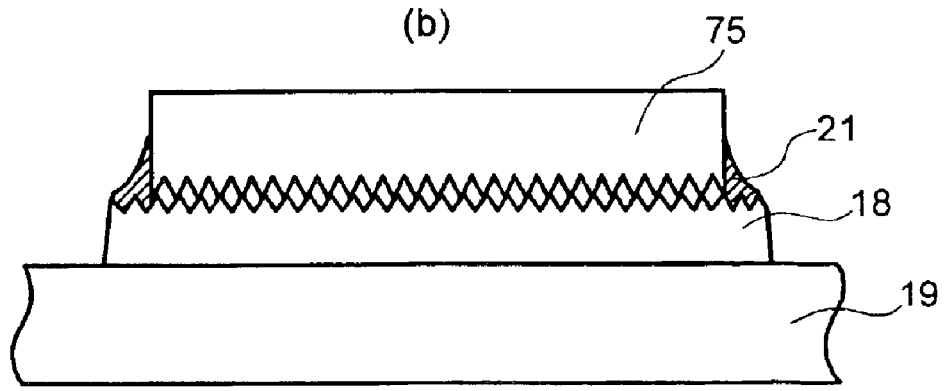

FIG.5
(a)
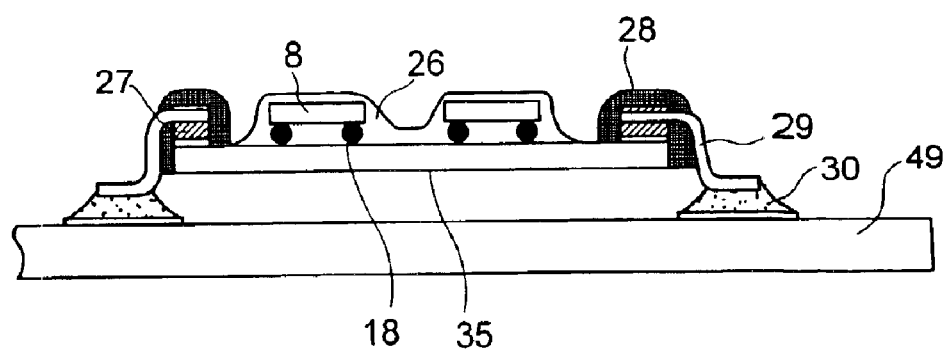
(b)
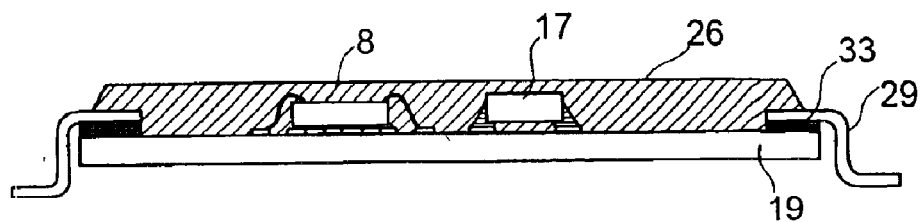
(c)
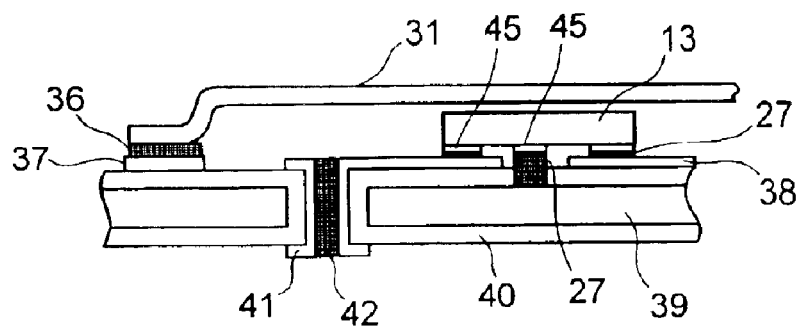

FIG.8
(A) STEPS OF ASSEMBLING MODULE
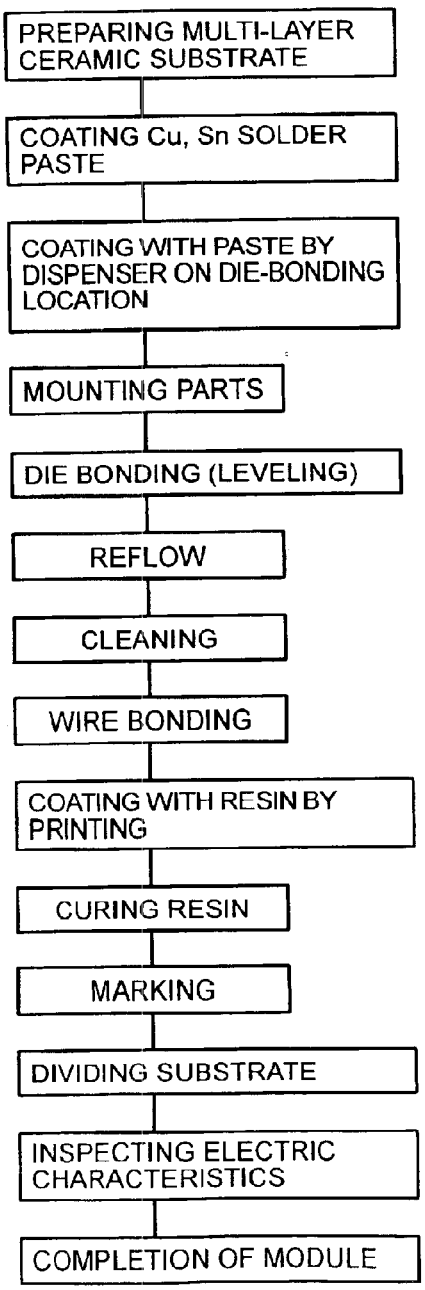
(B) STEPS OF SECONDARY MOUNTING AND ASSEMBLING OF MODULE
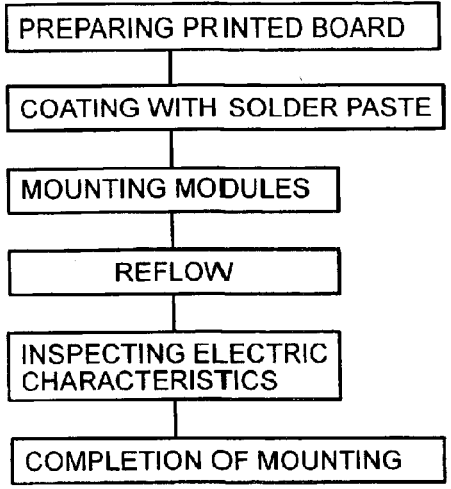

FIG.12
(a)
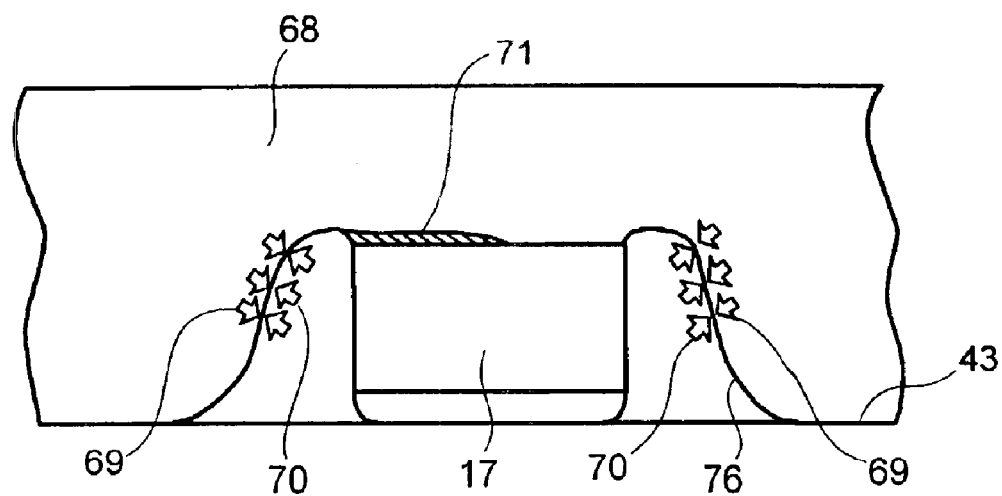
(b)
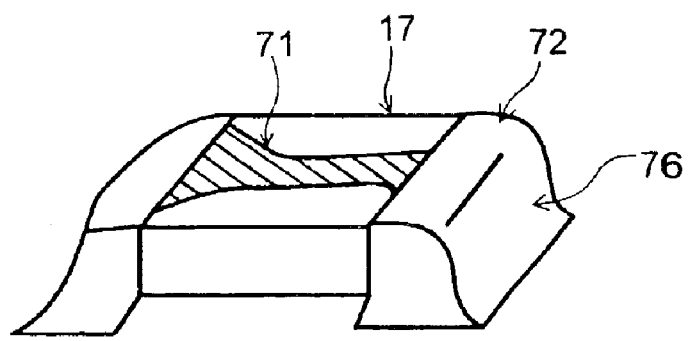

FIG.13

| | VOLUME EXPANSION (%) RATIO | YOUNG'S MODULUS REQUIRED IN RESIN | PHENOMENON |
|---|---|---|---|
| CONVENTIONAL TECHNIQUE (Pb BASED) | 3.6 (2.6) | AT 180°C 200MPa> | CREEP DEFORMATION OF LIQUID (INCLUDING SOLID PHASE) AT THE TIME OF REMELTING |
| THE INVENTION (Cu 50 / Sn 50) | 1.4 ※ (1) | AT 180°C 500MPa> ※ | JOINT IS EXPECTED THAT A BONDED PORTION DOES NOT MOVE BECAUSE Cu PARTICLES ARE FIXED TO EACH OTHER |
| ASSUMPTION | ※1/2 OF THAT OF Sn | ※THE VALUE OF CONVENTIONAL TECHNIQUE ABOUT 2.5 TIMES | |

FIG.14
(a)
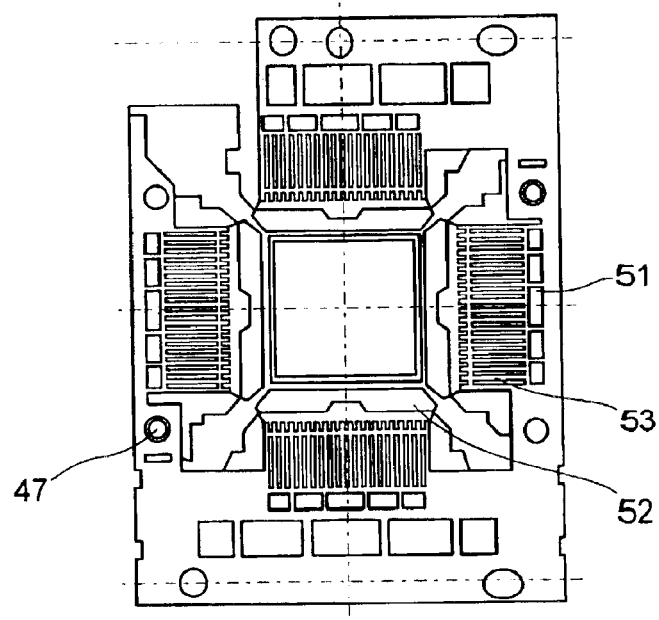
(b)
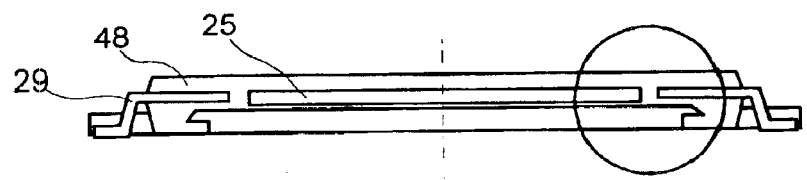
(c)
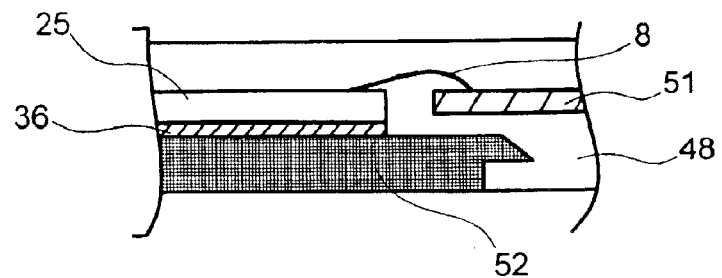

FIG.17
(a)
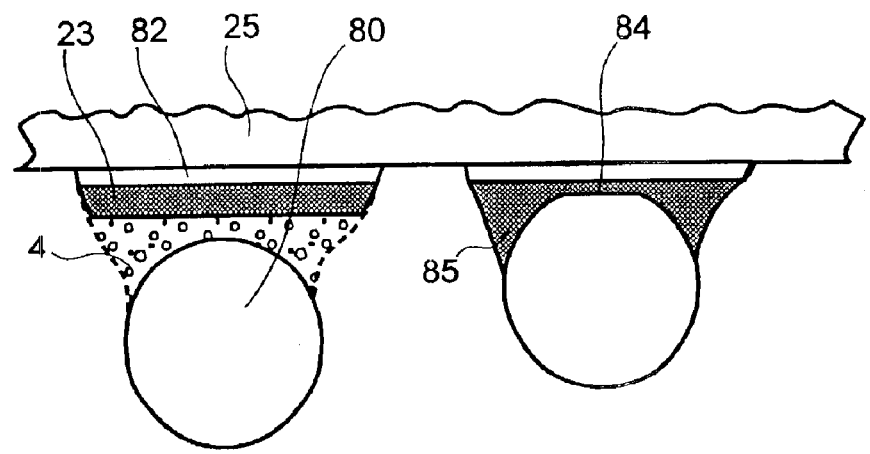
(b)
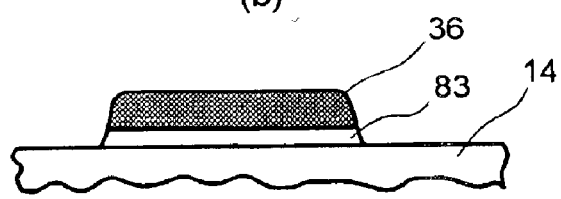
(c)
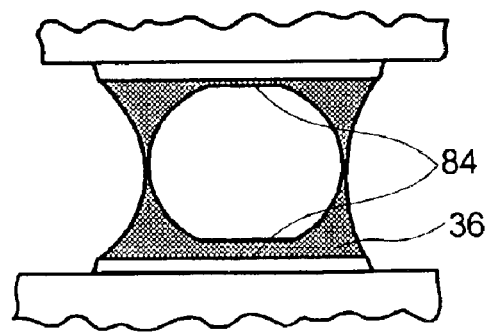

FIG.18
(a)
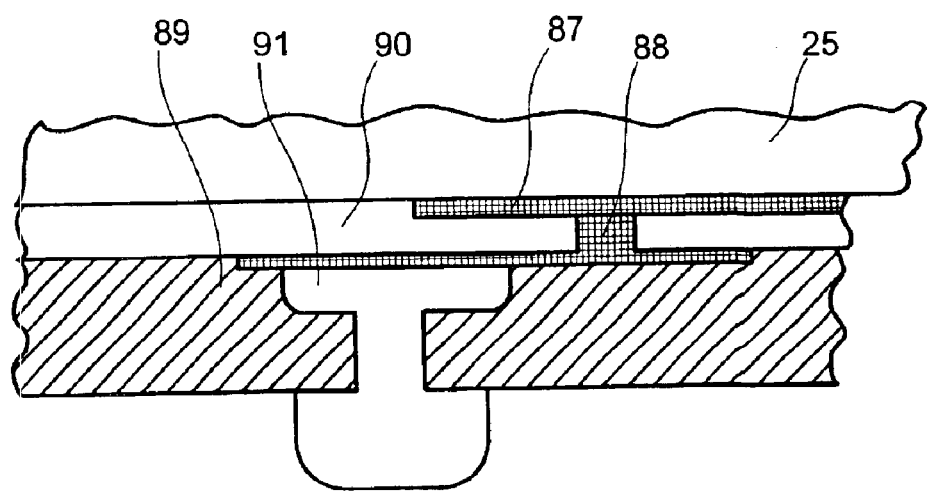
(b)
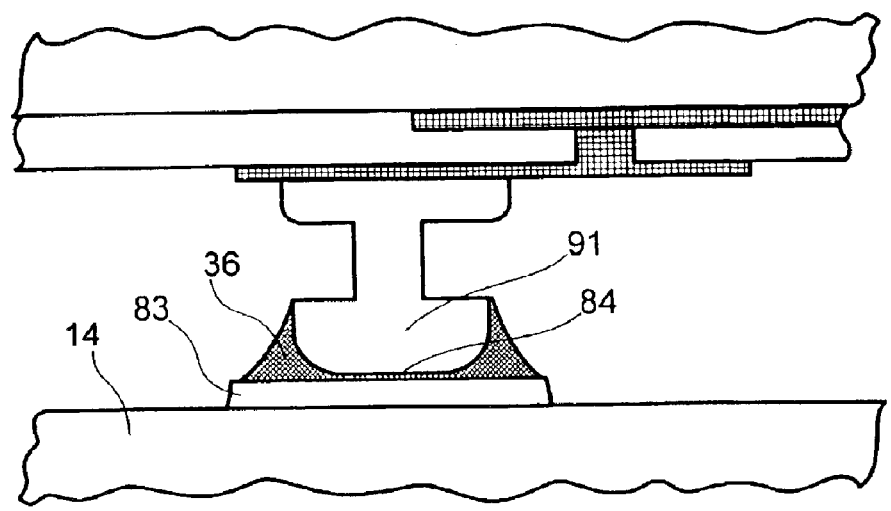

FIG.19

| Sn / Cu RATIO | EVALUATION AND JUDGING | REASON FOR JUDGING |
|---|---|---|
| 10/4 | × | ↑ |
| 10/5 | × | EXCESS OF Sn |
| 10/7 (1.43) | △ | |
| 10/8 (1.25) | △~○ | |
| 10/10 | ○ | PROPER RANGE / PREFERRED RANGE |
| 10/12.5 (0.8) | ○ | |
| 10/15 | △~○ | |
| 10/16.7 (0.6) | △ | |
| 10/25 | × | SHORT OF Sn |
| 10/50 | × | ↓ |
| 10/100 | × | ↓ |

CRITERION FOR JUDGING · ○ : PROPER  △ : ALMOST PROPER
· × : SHORT (OR EXCESS) OF Sn

FIG.20
(a)
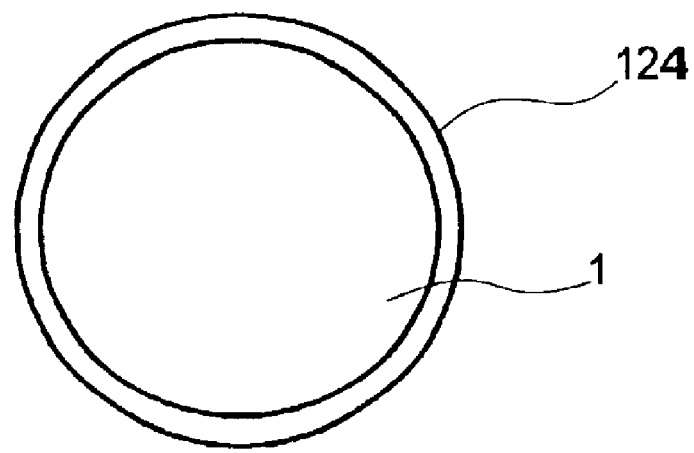
(b)
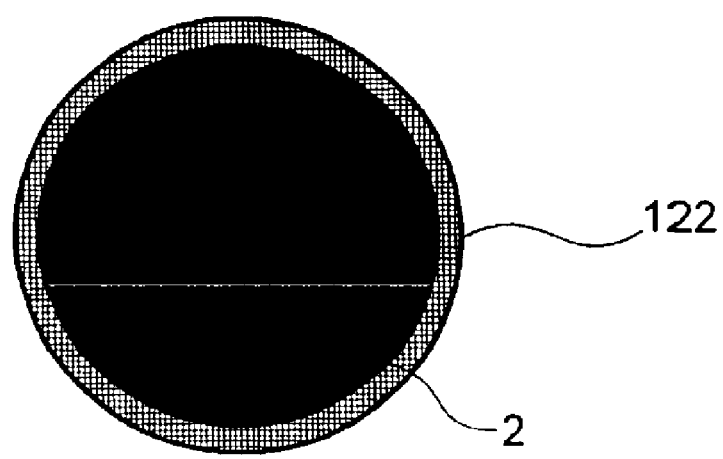

FIG.21
(a)
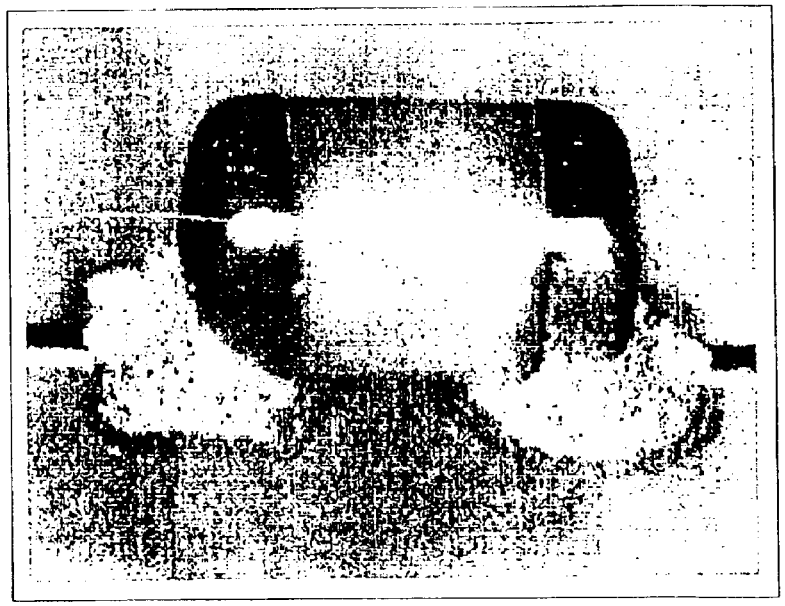
(b)
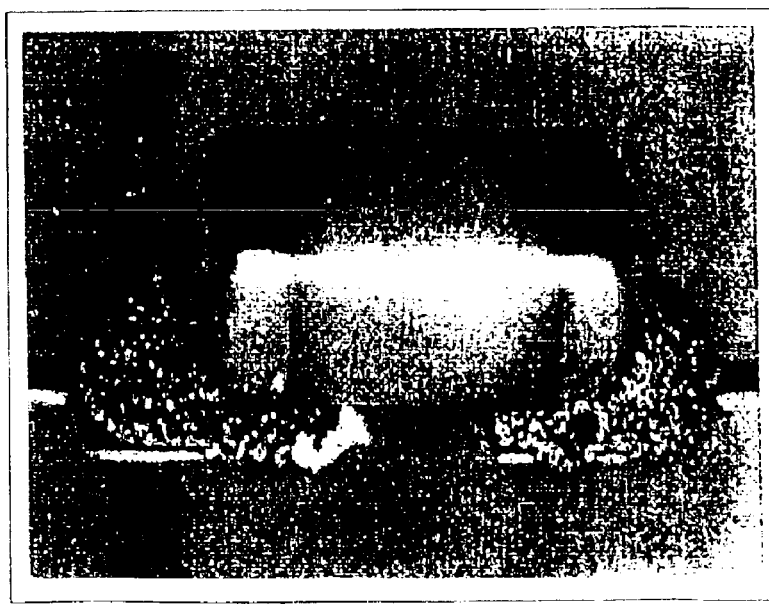

SOLDER

BACKGROUND OF THE INVENTION

1. Field of the Invention

The present invention relates to an electronic device that uses a lead-free solder (solder that contains at most a trace amount of lead) and, more particularly to an electronic device fabricated by solder bonding using a temperature hierarchy that is effective in mounting a module formed of the electronic device or the like.

2. Description of Related Art

In bonding using Sn—Pb-base solders, temperature-hierarchical bonding has been used. In this bonding technique, parts are soldered first at a temperature between 330 degrees centigrade and 350 degrees centigrade using solder for high-temperature soldering such as Pb-rich Pb-5 mass % Sn solder (melting point: 314–310 degrees centigrade) or Pb-10Sn mass % solder (melting point: 302–275 degrees centigrade). Thereafter, another bonding is performed without melting the soldered portion using solder for low-temperature soldering such as Sn-37Pb eutectics (183 degrees centigrade). (Hereafter, the indication of "mass %" is omitted and only the numeral is recited). This temperature-hierarchical bonding is used in the fabrication of semiconductor devices in which chips are die-bonded as well as in the fabrication of semiconductor devices that use flip chip bonding, etc. For example, temperature-hierarchical bonding is necessary for forming BGA, CSP, WL-CSP (Wafer Level CSP), a multi-chip module (abbreviated as MCM), and the like. In the semiconductor fabrication process, it has become important to provide temperature-hierarchical bonding that can perform soldering for bonding parts inside a semiconductor device and another soldering for bonding the semiconductor device, itself, to a substrate.

On the other hand, with respect to some products, there have been cases in which bonding at a temperature of not more than 290 degree centigrade is requested in consideration of the heat-resistance limit of parts. As solders having the compositions that fall in a composition range for high-temperature soldering suited to this requirement in conventional Sn—Pb-base solders, a Pb-15Sn solder (liquidus temperature: 285 degrees centigrade) and solders having similar compositions are considered. However, when the Sn content is above this level, low-temperature eutectics (183 degrees centigrade) precipitate. Furthermore, when the Sn content is below this level, the liquidus temperature rises; consequently, bonding at a temperature of $\leq 290$ degrees centigrade becomes difficult. For this reason, even when a secondary reflow solder for bonding to a printed circuit board is a eutectic Sn—Pb-base solder, the problem of remelting of high-temperature solder bonds is unavoidable. When Pb-free solders are used for secondary reflow, bonding is performed at a temperature that falls in a range of 240–250 degrees centigrade. This temperature is about 20–30 degrees centigrade higher than necessary for bonding using eutectic Sn—Pb-base solders. Accordingly, bonding at a temperature of $\leq 290$ degrees centigrade using Pb-free solder has further difficulties.

More specifically, at present, there is no high-temperature Pb-free soldering material that permits temperature-hierarchical bonding at a soldering temperature ranging from 330 to 350 degrees centigrade or at a temperature level of 290 degrees centigrade.

This situation is described in detail below. At present, Pb-free solders are being used increasingly in many applications to address environmental issues. With respect to Pb-free solders for soldering parts to printed circuit boards, eutectic Sn—Ag-base solders, eutectic Sn—Ag—Cu-base solders and eutectic Sn—Cu-base solders are becoming the mainstream. As a result, the soldering temperature in surface mounting is usually in a range of 240 to 250 degrees centigrade. However, there is no Pb-free solder for a temperature hierarchy on the higher-temperature side that can be used in combination with these eutectic Pb-free solders for surface mounting. The solder composition that is the most probable candidate for higher-temperature-side solder, is a Sn-5Sb solder (240–232 degree centigrade). However, taking into account the irregularities of temperature and the like on a substrate in a reflow furnace, no highly reliable lower-temperature-side solder exists that can bond without melting the Sn-5Sb solder. On the other hand, although an Au-20Sn solder (melting point: 280 degrees centigrade) is a known high-temperature solder, its use is limited because it is a hard material and its cost is high. Especially in bonding a Si chip to a material having an expansion coefficient that largely differs from an expansion coefficient of the Si chip, or in bonding a large-sized Si chip, Au-20Sn solder is not used because it is hard and may break the Si chip.

BRIEF SUMMARY OF THE INVENTION

A technique is needed that can cope with the demand for use of Pb-free solders and that enables bonding using a high-temperature side solder at a temperature $\leq 290$ degrees centigrade, the technique not exceeding the heat resistance of parts in module mounting (primary reflow) and the subsequent bonding in which terminals of a module are surface-mounted to external connection terminals of a printed circuit board or the like using a Sn-3Ag-0.5Cu solder (melting point: 217–221 degrees centigrade) (secondary reflow). For example, a high-frequency module for a portable product in which chip parts and semiconductor chips are mounted has been developed. In this module, the chip parts and the semiconductor chips are bonded to a module substrate using a high-temperature solder, after they are encapsulated using a cap or resin molding. These chip parts require bonding at a temperature of 290 degrees centigrade, maximum, in terms of the heat resistance thereof. However, since the temperature necessary for bonding using high-temperature-side solder is determined based on the heat resistance of the chip parts, that temperature is not always limited to 290 degrees centigrade. When the secondary reflow of this module is performed using the Sn-3Ag-0.5Cu solder, the soldering temperature reaches about 240 degrees centigrade. Therefore, in view of the fact that even an Sn-5Sb solder, which has the highest melting point among all Sn-base solders, has a melting point of 232 degrees centigrade and the melting point of the solder decreases further when the plating of a chip electrode contains Pb or the like therein, it is impossible to avoid the remelting of soldered portions of the chip parts in the module due to the second reflow. Accordingly, a system or a process that does not give rise to such problems even when a solder remelts is required.

To cope with such problems, it has been a conventional practice that chips are die-bonded to a module substrate at a temperature of 290 degrees centigrade, maximum, using a Pb-base solder to perform the reflow the chip parts. Then, a soft silicone gel is applied to the wire-bonded chips, the upper surface of the module substrate is covered with a cap made of Al or the like, and the secondary reflow is performed using a eutectic Sn—Pb solder. Due to this arrangement, in the secondary reflow, stresses are not applied even when a portion of the solder of a module junction melts: the chips are not moved and no problem in high-frequency characteristics arises. It becomes necessary, however, to perform the secondary reflow using Pb-free base solder and, at the same time, it has become indispensable to develop a resin-encapsulation-type module to reduce cost. To break through this situation, it is necessary to solve following problems.

1) Reflow soldering in air at a temperature not exceeding 290 degrees centigrade, maximum, must be possible (guaranteed heat-resisting temperature of chip parts: 290 degrees centigrade).

2) Melting must not occur in the secondary reflow (260 degrees centigrade, maximum) or even if the melting occurs, chips must not move (because high-frequency characteristics are affected if the chips move).

3) Even when the solder inside the module re-melts during the secondary reflow, a short-circuit due to the volume expansion of the solder for the chip parts must not occur.

Problems found on reviewing a result of an evaluation of an RF (Radio Frequency) module are described next. In an RF module, chip parts and a module substrate were bonded together using a conventional Pb-base solder. Although the Pb-base solder has a solidus line of 245 degrees centigrade, a Sn—Pb-base solder plating is applied to connection terminals of the chip parts and a low-temperature Sn—Pb-base eutectic is formed so that remelting occurs. The occurrence rate of short-circuits due to outflow of solder after secondary mounting reflow, was investigated with respect to modules that were encapsulated by one operation using various types of insulating resins having different moduli of elasticity.

FIG. 12(a) is an explanatory view of an outflow that shows the principle of solder flow during the secondary mounting reflow of a chip part in a module. FIG. 12(b) is a perspective view of an example of the solder flow of the chip part. The mechanism of a short-circuit due to a solder outflow is as follows. The melting and expanding pressure generated in a solder within a module causes an exfoliation along an interface between a chip part and resin or along an interface between the resin and a module substrate. Accordingly, the solder flows into the exfoliated interface as a flash so that terminals at both ends of a surface-mounted part are connected to each other, thus causing a short-circuit.

As a result of the above investigation, it became apparent that the number of occurrences of short-circuits due to solder outflow is proportional to the modulus of the elasticity of the resin. It also became apparent that conventional high-elasticity epoxy resins are inappropriate and that with respect to soft silicone resin, when the modulus of elasticity thereof at 180 degrees centigrade (melting point of Sn—Pb eutectics) is low, the short-circuit is not generated.

The low-elasticity resin, however, in practice, is usually silicone resin; thus, during the process of substrate division, due to the properties of resin, some parts of the resin cannot be completely divided and they may remain attached. In this case, a process for making cuts in the remaining parts using laser beams or the like becomes necessary. On the other hand, when a general epoxy resin is used, the mechanical dividing is possible, however, a short-circuit can occur because of the high hardness of the resin, thus making use of general epoxy undesirable. In terms of resin properties, at present, it is difficult to soften the resin to such an extent that a short-circuit does not occur at 180 degrees centigrade. If it is possible to perform resin encapsulation that can serve as mechanical protection and can, at the same time, can prevent solder outflow, covering with a case or a cap is unnecessary, and, the cost can be reduced.

Further, with respect to solder bonding using lead-free solder materials that is performed for fabricating electronic device (electronic devices) including RF modules, particularly with respect to soldering at a high temperature (solder bonding temperature: approximately 240 degrees centigrade to 300 degrees centigrade) in air, we have carried out experiments and made the following findings. Unlike soldering performed in an inert gas (for example, a nitrogen atmosphere), soldering in air generates the oxidation of a high-temperature-side lead-free soldering material which leads to serious problems in solder bonding such as the lowering of solder wettability and reliability of bonding. Further, since minute metal particles rapidly diffuse in the solder, the process of forming a compound is accelerated, thus elevating the melting point accordingly. The deformation of solder caused by the releasing of gas is not smoothly performed; consequently, the solder includes a large number of voids. This phenomenon is not limited to the soldering of the RF module.

This invention provides a new solder paste, a method of solder bonding, and a soldered joint structure. Particularly, the invention provides a solder paste, a method of solder bonding, and a soldered joint structure for lead-free solder bonding in air. The invention also provides temperature-hierarchical bonding using a solder capable of maintaining a bonding strength at a high temperature. Particularly, the invention provides temperature-hierarchical bonding that can reduce void defects and maintain the reliability at a high-temperature-side bonding portion even when soldering is performed in air.

The invention also provides an electronic device which includes solder bonding portions capable of maintaining bonding strength at a high temperature. The invention provides an electronic device with reliability of high-temperature-side bonding even when soldering is performed in the air.

The invention is directed to an electronic device which includes electronic parts and a mounting substrate on which the electronic parts are mounted, wherein electrodes of the electronic parts and electrodes of the mounting substrate are connected to each other by solder-bonding portions formed of a solder which comprises Sn-base solder balls and metal balls that have a melting point higher than a melting point of the Sn solder balls, and in which a surface of each metal ball is covered with a Ni layer and the Ni layer is covered with an Au layer.

The invention provides an electronic device that includes semiconductor devices and a mounting substrate on which the semiconductor devices are mounted, wherein electrodes of the semiconductor devices and electrodes of the mounting substrate are connected to each other by bonding portions, each of which is formed by making a solder subjected to a reflow, wherein the solder comprises Sn-base solder balls and metal balls which have a melting point higher than a melting point of the Sn solder balls, each metal ball being covered with a Ni layer, the Ni layer being covered with an Au layer, and the metal balls being bonded together by a compound made of the metal and the Sn.

The invention is also directed to an electronic device which includes semiconductor devices, a first substrate on which the semiconductor devices are mounted, and a second substrate on which the first substrate is mounted, wherein electrodes of the semiconductor devices and electrodes of the first substrate are connected to each other by bonding portions each of which is formed by making a solder subjected to a reflow, wherein the solder comprises Sn-base solder balls and metal balls that have a melting point higher than a melting point of the Sn-base solder balls, each metal ball being covered with a Ni layer, and the Ni layer being covered with an Au layer; and further, the electrodes of the first substrate and electrodes of the second substrate are connected to each other by bonding portions, each of which is formed of at least any one of a Sn—Ag-base solder, a Sn—Ag—Cu-base solder, a Sn—Cu-base solder or a Sn—Zn-base solder.

The invention also provides an electronic device which includes semiconductor chips and a substrate on which the semiconductor chips are mounted, wherein bonding terminals of the substrate are connected with bonding terminals that are formed on first side surfaces of the semiconductor chips by wire bonding, and second side surfaces of the semiconductor chips and the substrate are connected to each other by bonding portions, each of which is formed by making a solder subjected to a reflow, wherein the solder comprises Sn-base solder balls and metal balls that have a melting point higher than a melting point of the Sn-base solder balls, each metal ball being covered with a Ni layer, the Ni layer being covered with an Au layer, and the metal balls of the bonding portion being bonded together by a compound made of the metal and the Sn.

The invention also provides a method for fabricating an electronic device which includes electronic parts, a first substrate on which the electronic parts are mounted, and a second substrate on which the first substrate is mounted, wherein the method comprises a first step in which electrodes of the electronic parts and electrodes of the first substrate are connected to each other by making a first lead-free solder subjected to a reflow at a temperature equal to or more than 240 degrees centigrade and equal to or less than a heat resistance temperature of the electronic parts, wherein the first lead-free solder includes Sn-base solder balls and metal balls having a melting point higher than a melting point of the Sn-base solder balls, each metal ball being covered with a Ni layer and the Ni layer being covered with an Au layer; and a second step in which the first substrate on which the electronic parts are mounted and the second substrate are bonded to each other by making a second lead-free solder subjected to a reflow at a temperature lower than the reflow temperature in the first step.

Further, in an electronic device in which a first substrate having electronic parts mounted thereon is mounted on a second substrate such as a printed circuit board or a mother board, the bonding of the electronic parts to the first substrate is performed by a reflow of solder paste containing Cu balls and Sn-base solder balls, and the bonding of the first substrate to the second substrate is performed by a reflow of an Sn-(2.0–3.5)Ag-(0.5–1.0)Cu solder.

For example, with respect to temperature-hierarchical bonding, even when a bonded portion of a solder on the higher-temperature side melts, provided that other portions of the solder do not melt, the solder can ensure a strength sufficient to withstand a process that is performed during the subsequent solder bonding.

The melting points of intermetallic compounds are high. Because portions bonded with intermetallic compounds can provide sufficient bonding strength even at 300 degrees centigrade, the intermetallic compounds can be used for temperature-hierarchical bonding on the high-temperature side. Therefore, the present inventors performed bonding using a paste which is a mixture of Cu (or Ag, Au, Al or plastic) balls or used these balls with their surfaces plated with Sn or the like, and Sn-base solder balls, wherein both were mixed in the paste at volume ratios of about 50%, respectively. As a result, in portions where the Cu balls are in contact with each other or are arranged close to each other, a reaction with surrounding molten Sn occurs and a Cu6Sn5 intermetallic compound is formed because of diffusion between Cu and Sn, making it possible to ensure sufficient bonding strength between the Cu balls at high temperatures. Because the melting point of this compound is high and sufficient strength is ensured at a soldering temperature of 250 degrees centigrade (only the Sn portion melts), no exfoliation of bonded portions occurs during the secondary reflow performed for mounting the module onto the printed circuit board. Therefore, the soldered portions of the module are made of a composite material having two functions, that is, the first function of ensuring high-temperature strength during secondary reflow by elastic bonding force brought about from the bonding of the high-melting-point compound and the second function of ensuring service life by the flexibility of soft Sn during temperature cycles. Therefore, the soldered portions can be adequately used in temperature-hierarchical bonding at high temperatures.

Furthermore, it is also possible to use the hard and high-rigidity solders having desirable melting points, such as an Au-20Sn solder, Au-(50–55)Sn solders (melting point: 309–370 degrees centigrade) and Au-12Ge (melting point: 356 degrees centigrade). In this case, by using the granular Cu and Sn particles and dispersing and mixing soft and elastic rubber particles or by dispersing and mixing soft low-melting-point solders of Sn, In or the like into the above-mentioned hard and high-rigidity solders, it is possible to ensure sufficient bonding strength even at temperatures of not less than the solidus temperatures of the above hard and high-rigidity solders and to alleviate the phenomena caused due to deformation by the soft Sn, In or rubber present among the metal particles, whereby a new advantageous effect to compensate for the drawbacks of solders can be expected.

Next, the solution means applied to the resin-encapsulated RF module structure is described. Countermeasures to prevent short-circuits attributed to soldering include (1) a structure in which the solder within the module does not melt in the secondary mounting reflow; and (2) a structure in which even when the solder within the module melts, exfoliation at the interfaces between parts and the resin and at the interface between the resin and the module substrate is prevented by reducing the melting-and-expanding pressure of the solder. However, it is difficult to provide a desirable resin in accordance with these measures.

On the other hand, (3) a structure which alleviates the melting-and-expanding pressure of a molten internal solder using a low-hardness resin in a gel state, etc., is also considered. However, because of the low protective force (mechanical strength) of the structure, covering the solder with a case or cap is required. This measure cannot be adopted because the technique pushes up the cost.

FIG. 13 (described in more detail later) shows a comparison of phenomena of molten solder flow between a case where a conventional solder is used in a resin encapsulation structure and a case where the solder of the invention is used. The volume expansion of Pb-base solders is 3.6% (Science and Engineering of Metallic Materials, Masuo Kawamori, p. 14442). According to the bonding structure of the invention, only Sn melts at a temperature of about 240 degrees centigrade during the secondary reflow mounting. Therefore, in view of the fact that the volume ratio between Cu balls and Sn balls is about 50% to 50%, the volume expansion of the solder of the invention immediately after melting is 1.4%, which is about 1/2.5 times as large as the volume expansion of Pb-base solders. On the other hand, with respect to the state of remelting, the conventional solder instantaneously expands by 3.6% when the solder remelts. Therefore, when the conventional solder is made of a hard resin, since the resin cannot be deformed, the pressure increases and the molten solder flows into the interfaces formed between the chip parts and the resin. For this reason, it is necessary to ise soft resin in conventional solder. On the other hand, in the solder of the invention, as is apparent from a model of the cross section of a chip shown in FIG. 1 (described later), Cu particles are bonded together mainly via Cu6Sn5 compounds. Accordingly, even when the Sn in the gap among Cu particles melts, the Cu particles do not move because they are bonded together.

Therefore, the pressure generated by the resin balances with a repulsive force of the bonded Cu particles pressure is not easily applied to the molten Sn. Further, since the volume expansion of the bonded portion is low, that is, 1/2.5 times as large as that of the conventional solder, it is expected that, because of the synergistic effect of both of solders, the possibility of Sn flowing into the interfaces of chip parts is low. Thus, by adopting the bonding structure of the invention in the module, it is possible to provide a low-cost RF module that can be encapsulated with a slightly softened epoxy resin and that, at the same time, can be easily cut.

BRIEF DESCRIPTION OF THE DRAWINGS

FIG. 1(a) to FIG. 1(c) are cross-sectional views of a model showing the material and composition of a paste for bonding.

FIG. 3(a) and FIG. 3(b) are cross-sectional views of a case where the invention is applied to a surface etching pattern.

FIG. 5(a) to FIG. 5(c) are cross-sectional views of a model in which a module is mounted on a printed circuit board.

FIG. 8(a) and FIG. 8(b) are process flow charts of RF module mounting.

FIG. 12(a) and FIG. 12(b) are a cross-sectional view and a perspective view, respectively, of the principle of solder flow in a comparative example of an RF module.

FIG. 13 is a view showing a comparison of the phenomena of an RF module between a comparative example and a example according to the invention.

FIG. 14(a) to FIG. 14(c) are a plan view of a high-output resin package and a cross-sectional view of the package.

FIG. 17(a) to FIG. 17(c) are cross-sectional views of a model of BGA/CSP in which Cu ball bumps are used.

FIG. 18(a) to FIG. 18(b) are cross-sectional views of a model of BGA/CSP in which Cu-coated bumps of deformed structure are used.

FIG. 19 shows the relationship between the Sn/Cu ratio and an appropriate range of bonding.

FIG. 20(a) and FIG. 20(b) are views showing a model of a cross section showing the material and the constitution of a bonding paste.

FIG. 21(a) and FIG. 21(b) are views showing solder in an operation that performs a solder reflow in a nitrogen atmosphere and in the air.

DETAILED DESCRIPTION OF THE INVENTION

Figure 2:
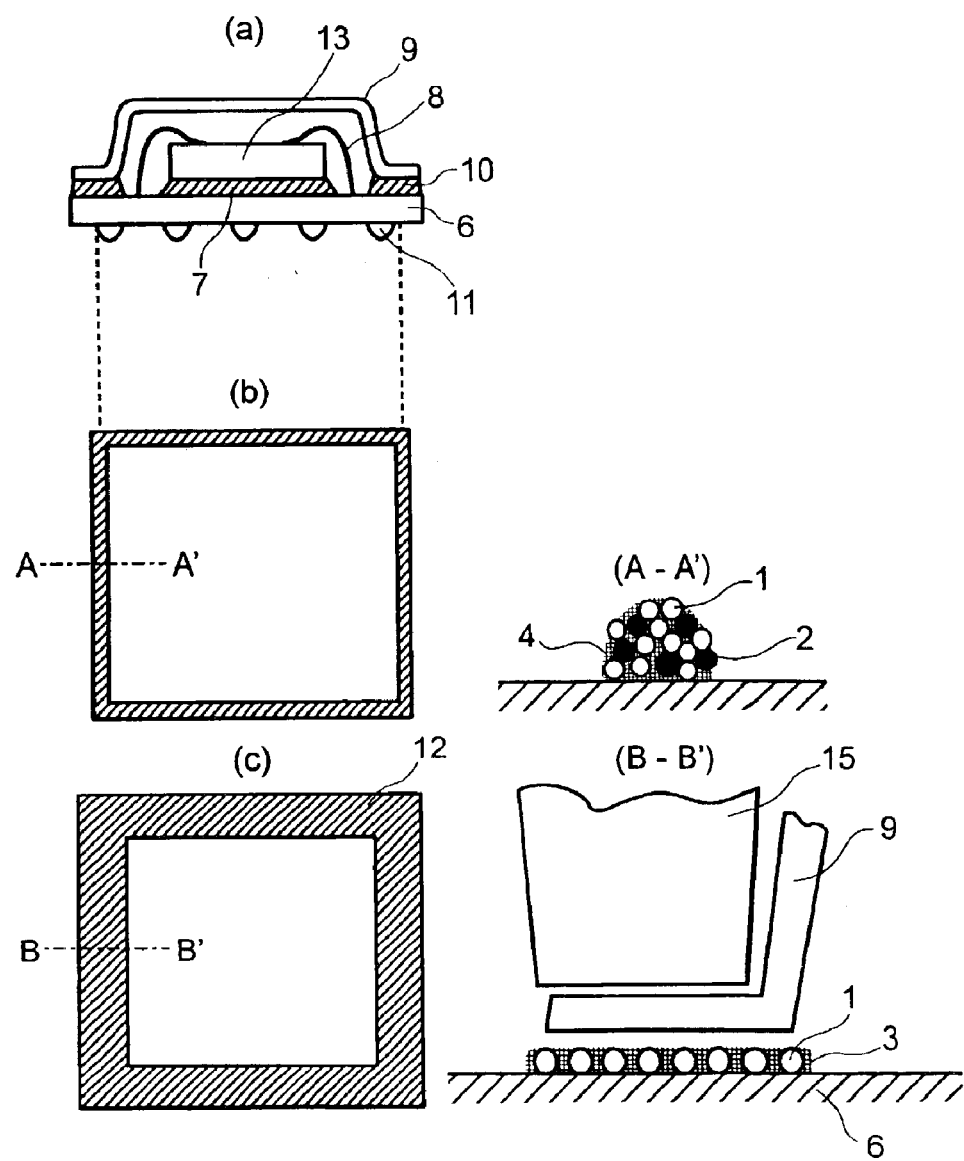
FIG. 2(a) shows a cross section of an example to which the invention is applied and FIG. 2(b) and FIG. 2(c) are model views of a method of paste supply and a bonded condition, respectively.

Embodiments of the invention are described below.
(Embodiment 1)

FIG. 1(a) to FIG. 1(c) show the concept of a bonding structure according to the invention. This drawing also shows the pre-soldering condition and the post-soldering condition. FIG. 1(a) shows an example that uses a paste in which Cu balls 1 with a particle size of about 30 $\mu$m (or balls of Ag, Au, Cu—Sn alloys or the like) and Sn-base solder balls 2 (melting point: 232 degrees centigrade) with a particle size of about 30 $\mu$m are appropriately dispersed in small quantities via a flux 4. When this paste is subjected to reflow at a temperature of not less than 250 degrees centigrade, Sn-base solder balls 2 melt, a molten Sn 3 spreads such that molten Sn 3 wets Cu balls 1 and is distributed relatively uniformly between Cu balls 1. Thereafter, Cu balls 1 and molten Sn 3 react with each other so that Cu balls 1 are connected to each other with the aid of compounds of Cu and Sn (mainly Cu6Sn5). The particle sizes of Cu balls 1 and Sn-base solder balls 2 are not limited to the above-mentioned values.

Because the Cu6Sn5 compound can be formed in a short time by setting the reflow temperature as high as possible, the aging process for forming the compound is unnecessary. When formation of the Cu6Sn5 compound is insufficient, it is necessary to ensure the strength of bonding between Cu balls 1 with short aging in a temperature range of the heat resistance of the parts. Because the melting point of the Cu6Sn5 compound is as high as about 630 degrees centigrade and the mechanical properties of the Cu6Sn5 compound are not poor, there is no problem with strength. If aging is executed for a long time at a high temperature, Cu3Sn compound develops to the Cu side. The mechanical properties of Cu3Sn are generally considered to be hard and brittle. However, even when Cu3Sn is formed within the solder around each of the Cu particles, there is no problem insofar as it has no effect on serviceable life measured in a temperature cycle test, etc. In an experiment in which Cu3Sn was sufficiently formed at a high temperature in a short time, there was no problem with strength. This is because there is a difference in the fracturing effect of Cu3Sn when Cu3Sn is formed extended along the bonding interface and when Cu3Sn is formed around each of the particles, as in this example. It is believed that the soft Sn 3 present around the compound improves its performance.

Since the Cu balls are bonded to each other via the compounds (Cu6Sn5), neither the junctions (Cu6Sn5) nor the Cu balls melt, and it becomes possible to ensure the bonding strength even when the module passes through a reflow furnace at about 240 degrees centigrade after bonding. In taking the reliability of bonding among Cu balls 1 into account, it is preferred that the compounds (Cu6Sn5) are formed with a thickness of about a few micrometers. However, it is not necessary that all adjoining Cu particles be bonded together by the compound. Instead, in terms of probability, it is preferred that portions where linkage of Cu balls 1 generated by the compound does not exist be present, because this provides a degree of freedom in deformation of the solder.

FIG. 1(b) shows another example in which Cu balls 1 are plated with Sn or the like (thickness: approximately 0 to not more than 0.1 $\mu$m in thickness). When the amount of Sn is insufficient due to the thin Sn plating, the insufficient amount of Sn is compensated for by Sn balls having the same ball diameter as solder balls 2. The Sn plating applied to Cu balls 1 enables the molten Sn 3 to readily spread along Cu balls 1 and wet them, making the gaps among Cu balls 1 more uniform. Further, this has the great advantage of eliminating voids. The oxide film of the solder plating is broken during the reflow and Cu balls 1 are drawn to each other under by surface tension and approach each other to form a Cu6Sn5 compound. Further, the fluidity of the solder is improved by adding a trace amount (1–2%) of Bi, etc. to Sn to thereby improve the wettability of the solder on the terminals. However, addition of a large amount of Bi is undesirable because the solder becomes brittle.

The solder shown in FIG. 1(a) and FIG. 1(b) is extremely effective when the soldering is performed in a nitrogen atmosphere. Further, even when the soldering is performed in air, this solder is effective provided that the temperature is $\leq$240 degrees centigrade. This is because the oxidizing phenomenon of Cu balls 1, Sn-based solder balls 2, and the flux 4 is not as active at a temperature $\leq$240 degrees centigrade. The Sn-base solder is a composition that contains Sn-(0–4)Ag-(0–2)Cu into which Sb, Bi, Ni or the like are mixed. Particularly, with respect to the flux, even when cleaning is performed a problem with residue persists;thus, a weak rosin flux is generally used. The effect of oxidation of the flux 4 on the reliability of bonding is not considerable.

However, when the soldering is performed in air and at a temperature exceeding 240 degrees centigrade (it is preferable to perform the soldering at a temperature that falls in a range of 240–300 degrees centigrade in view of the heat resistance of the electronic parts), the reliability of bonding is reduced due to oxidation, or the like, of the Cu balls, the Sn-base solder balls, and the flux. For example, in an experiment on solder bonding carried out in air at a temperature of 290 degrees centigrade using the solder paste shown in FIG. 1(a) and FIG. 1(b), the solder bonding portions are discolored due to oxidation, thus indicating reduction in the reliability of bonding. FIG. 21(a) and FIG. 21(b) show a result of the experiment, wherein FIG. 21(a) shows a 1005 chip part bonded to a heat-resistant substrate in a nitrogen atmosphere by reflow and FIG. 21 (b) shows a 1005 chip part bonded to a heat-resistant substrate in air. In the bonding structure obtained in air, the solder surface is oxidized and discolored. Further, the bonding structure shows the poor wettability. Here, the temperature, 290 degrees centigrade, was set by taking into account the heat resistance of a semiconductor device (semiconductor chip) or an electronic component that was mounted on a printed circuit board. However, this does not imply that the upper limit of the reflow temperature of the solder according to the present invention is 290 degrees centigrade.

The result the experiment is now specifically explained. In the solder paste according to the embodiment shown in FIG. 1(a) and FIG. 1(b), all of the Cu balls 1, the Sn-base solder balls 2 and the flux 4 are subjected to oxidization due to the reflow. That is, when the quantity of flux 4 is large, Cu balls 1 and Sn-base solder balls 2 are present in flux 4 in a liquid form so that they are not in contact with the air and are not oxidized. However, in the solder according to this invention, which combines Cu balls 1 and Sn-base solder balls 2, the diameters of the Cu balls and the Sn-base solder balls range from several $\mu$m to several tens $\mu$m (approximately 5 $\mu$m to 40 $\mu$m or 1 $\mu$m to 5 $\mu$m when the flow-out of Cu is controlled); thus, the total surface area of the aggregate of Cu balls 1 and Sn-base solder balls 2 becomes large. Yet the amount of flux 4 in the paste is limited to maintain the performance of the paste. Accordingly, it is difficult to cover the aggregate of Cu balls 1 and Sn-base solder balls 2 with flux 4 and portions of the balls are not exposed to flux 4. Accordingly, a high possibility exists that Cu balls 1 and Sn-base solder balls 2 are oxidized in air. The Sn is particularly liable to be oxidized.

On the other hand, with respect to the Cu balls, when the Sn-base solder balls 2 melt during the reflow time, Cu balls 1 are covered with molten Sn-base solder 3 and it is considered that Cu balls 1 are not oxidized. However, the portions of Cu balls 1 that are covered with only the Sn-base solder, that is, the portions of Cu balls 1 on which the compound formed by the Sn-base solder and Cu does not extend over the whole surface of the Cu balls because of the poor wettability and spreading of the Cu, are in an exposed state. Accordingly, Cu balls 1 are oxidized. Further, until the Sn-base solder melts when the temperature reaches 232 degrees centigrade, the Cu is also heated by preheating or the like.

The flux serves the function of reducing oxidization of Cu balls 1 and Sn-base solder balls 2. However, due to the fact that flux 4 per se is actively oxidized when the temperature is $\geq$240 degrees centigrade and all the flux 4 becomes oxidized, and because the oxidization reducing strength of flux 4 deteriorates when a small amount of flux 4 is used, flux 4 cannot reduce the oxidation of Cu balls 1 and Sn-base solder balls 2. Further, although a rosin-base flux can reduce the amount of copper oxide, rosin-base flux is not effective to reduce the oxide in tin. When Cu balls 1 are oxidized, it is difficult for molten Sn 3 to wet and spread over Cu balls 1 and the formation of the compound Cu6Sn5 becomes difficult, and the reliability of solder bonding using the high-temperature side solder is decreased. Particularly, in the state shown in FIG. 1(a), the Cu balls 1 are exposed and may be oxidized.

Further, in the state shown in FIG. 1(b), although Cu balls 1 are covered with Sn, a thin Sn film having a thickness of approximately 0.1 $\mu$m is not sufficient to prevent oxidation of Cu balls 1. Here, it is technically difficult to form a Sn film having a thickness of several $\mu$m on the surface of Cu ball 1 having a particle size of several tens $\mu$m. Further, when Cu ball 1 is covered with the thin Sn film, a compound formed of Sn and Cu (Cu3Sn) is liable to be formed and it is possible that this Cu3Sn is oxidized. Reducing the oxidized compound formed of Sn and Cu is more difficult than reducing a Cu oxide and an Sn oxide. Further, once the Cu3Sn is formed, Sn cannot wet the Cu balls 1.

As described above in conjunction with FIG. 1(a) and FIG. 1(b), when soldering is performed in air at a temperature that exceeds approximately 240 degrees centigrade, a problem of bonding reliability arises. In view of the above, we have made a further extensive study on this point and have found that a solder paste shown in FIG. 1(c) can ensure the reliability of bonding even under the above-mentioned conditions.

The solder paste shown in FIG. 1(c) contains Cu balls whose surfaces are covered with N/Au platings 124, Sn-base solder balls 2 and a flux 4. FIG. 20(a) shows a Cu ball 1 with a surface on which Ni/Au plating 124 is formed. Here, Au prevents the oxidation of Cu and Ni. Further, Ni prevents the diffusion of Au into Cu and prevents the flow-out (melting) of Cu into Sn, which occurs when reflow is performed at a temperature ≧240 degrees centigrade. Particularly, when the size of Cu particles is small, Cu readily melts into the Sn-based solder at high temperatures. In typical soldering, Cu melts and expels a reaction gas and solidification is completed. However, when the diffusion of Cu into the solder is excessively fast, a Cu—Sn compound is formed and the melting point is elevated; thus, solidification is readily completed in a state where gas is not discharged. Accordingly, when the solder remains in a gap defined between a chip and a substrate, this increases voids in appearance. Such a drawback can be overcome by using Ni as a barrier. That is, Ni can prevent the flow-out of Cu into the solder and the normal soldering can be performed. Here, Cu3Sn prevents Sn from wetting and spreading over the surface of Cu balls 1. Cu3Sn is, in general, hard and brittle. Since the Ni plating prevents the diffusion of Au into Cu and prevents oxidation of Cu even at a high temperature so long as the Sn does not wet, when the solder wets, Cu spreads into the solder (Sn) after reflow.

To prevent Au from spreading over the surfaces of the Cu balls, it is usually necessary to set the thickness of the Ni film to a value greater than 0.1 μm. On the other hand, a film thickness that can be formed on a particle having a particle size of several 10 μm is approximately 1 μm. Accordingly, it is preferable to set the film thickness of Ni to a value that falls in a range from 0.1 μm to 1 μm. It is also possible to increase the thickness of the Ni plating film, thus forming the compound Ni3Sn4, which bonds the Cu particles to each other.

Further, a film thickness of Au is set to a value sufficient for preventing the oxidation of Ni and Cu, preferably to ≧0.01 μm, taking into consideration the fact that Au covers the whole Cu ball 1, which has irregularities on its surface. Alternatively, to determine the film thickness of Au by taking the cost and a film thickness that is obtainable by a plating method (flush plating method) into consideration, it is preferable to set the film thickness of Au to ≧0.005 to 0.1 μm.

Here, when Au plating having a substantial thickness is formed preliminarily, taking into consideration the fact that Au diffuses into Cu ball 1, it is not always necessary to form the Ni plating film. However, in view of the cost and technical difficulties in forming Au plating film having a substantial thickness (≧0.1 μm), it is preferable to form the Ni plating film.

Further, as shown in FIG. 20(b), to prevent the oxidation of Sn and the active reaction of Sn with the Cu ball, it is preferable to form a protective film 122 on the surface of Sn-base solder ball 2. As the protective film, it is possible to use (1) a resin film having a flux action, such as a urethane film; (2) a coating film made of glycerin or the like; (3) a plasma-cleaning film formed of Ar or the like; (4) a sputtering film using ions or atoms of Ar or the like, and other such materials. With respect to Sn-base solder ball 2, even when a surface thereof is slightly oxidized, the clean Sn still remains inside and when the solder paste is subjected to reflow at a temperature ≧240 degrees centigrade, the inner clean Sn appears by breaking the oxide film. Accordingly, although the formation of the protective film 122 on the surface of Sn-base solder ball 2 is not always necessary, the formation of the protective film 122 can suppress oxidation of Sn-base solder ball 2 to a least amount and can ensure the reliability of solder bonding portions.

When the solder paste (FIG. 1(c)) containing the Cu balls 1 whose surfaces are covered with the Ni/Au plating 124 and Sn-base solder balls 2 is subjected to reflow, in the same manner as the solder pastes shown in FIG. 1(a) and FIG. 1(b), Cu balls 1 are bonded to each other by the compound (Cu6Sn5) formed of Cu and Sn. In this manner, according to the solder shown in FIG. 1(c), even in the air and at a temperature of approximately ≧240 degrees centigrade, it is possible to prevent the oxidation of Cu balls 1, which affect the reliability of bonding most, and to ensure the bonding reliability of the solder bonding portions.

Besides Cu balls 1 and Sn-base solder balls 2, Cu6Sn5 balls formed of an intermetallic compound made of Cu and Sn may be preliminarily contained in the solder paste. In this case, even when the oxidation of Cu balls 1 and Sn-base solder balls 2 chances to occur, the Cu balls are liable to be easily bonded to each other due to Cu6Sn5. Since the flow-out amount of Cu into Sn is small with respect to the Cu6Sn5 balls, there arises no drawback that the resiliency between Cu balls 1 is restricted by the excessive formation of Cu6Sn5 even at high temperatures. The solder paste shown in FIG. 1(a) to FIG. 1(c) can be used in the fabrication of the electronic devices and the electronic parts that have been disclosed in the above-mentioned respective embodiments.

Next, electronic parts such as LSI packages and parts having this bonding structure are mounted on a printed circuit board. In this mounting, temperature-hierarchical bonding becomes necessary. For example, after applying an Sn-3Ag-0.5Cu solder paste (melting point: 221–217 degrees centigrade) on connection terminals of a printed circuit board and mounting electronic parts such as LSI packages and parts reflow can be performed at 240 degrees centigrade in an air or a nitrogen atmosphere. Particularly, with respect to the solder shown in FIG. 1(c), it is possible to perform the reflow at a temperature in a range from not lower than 240 degrees centigrade to the heat resistance temperature of the electronic parts (for example, from not lower than 240 degrees centigrade to not higher than 300 degrees centigrade). This Sn-(2.0–3.5)Ag-(0.5–1.0)Cu solder is treated as a standard solder that replaces conventional eutectic Sn—Pb solders. However, because this solder has a higher melting point than the eutectic Sn—Pb solders, it is required that a high-temperature Pb-free solder suitable for this purpose be developed. As mentioned above, strength at high temperatures is ensured between Cu and Cu6Sn5 in the already-formed junctions and the strength of the junctions is high enough to withstand stresses caused by the deformation of a printed circuit board during reflow, etc. Therefore, even when the Sn-(2.0–3.5)Ag-(0.5–1.0) Cu solder is used for secondary reflow for soldering to a printed circuit board, this solder can carry out temperature-hierarchical bonding because the solder was designed for high-temperature-use and holds. In this case, the flux to be used may be an RMA (rosin mild activated) type for non-cleaning application or an RA (rosin activated) type for cleaning application, and both the cleaning type and the non-cleaning type can be used.

(Embodiment 2)

In FIG. 2(a), a semiconductor device 13 is bonded to a junction substrate 6 using an Au-20Sn solder 7 or the like. After wire bonding using gold wires 8 or the like, a peripheral portion of a cap 9, which is fabricated by applying a Ni-Au plating to an Al plate, a Fe—Ni plate or the like is bonded to junction substrate 6 by reflow through a solder paste 10 of the above-mentioned non-cleaning type. In this embodiment, when the insulating characteristic is regarded as important, it is desirable to perform bonding in a nitrogen atmosphere using a solder with a flux not containing chlorine. However, when wettability cannot be ensured, encapsulation with a weak-activity rosin of the RMA type may be performed. It is not necessary to ensure the complete encapsulation or the sealing of semiconductor device 13. That is, provided that the flux has sufficient insulating characteristics, even when semiconductor device 13 is held in the presence of the flux for a long time, the semiconductor device is not adversely affected. The purpose of the encapsulation using cap 9 is mainly to achieve mechanical protection. One exemplary method of encapsulation is pressure bonding of a sealing portion using a pulse-current resistance heating body 15 or the like. In this case, the paste is applied along the sealing portion using a dispenser and a fine continuous pattern 12 is formed (FIG. 2(b)).

A model of the cross section A–A' of the pattern is shown in an enlarged form on the right side of FIG. 2. Cu balls 1 and Sn solder balls 2 are held by flux 4. When the bonding of cap 9 and junction substrate 6 is performed using pulse-current resistance heating body 15 while applying pressure to the paste from above, the paste is made flat as shown in FIG. 2(c). A cross section B–B', which indicates that the paste is made flat, is shown in an enlarged form on the right side of FIG. 2. In this case, when Cu balls 1 having a size of 30 $\mu$m are used, the solder bonding portion between junction substrate 6 and cap 9 provides a gap of a size (about 50 $\mu$m) which is 1 to 1.5 times the size of Cu balls 1. Because the bonding under pressure using pulse heating body 15 was performed at 350 degrees centigrade, at maximum, for 5 seconds, the contact portion between Cu ball 1 and the terminal of junction substrate 6 and the contact portion between Cu ball 1 and cap 9 readily form Cu6Sn5 or Ni3Sn4 compounds in a short time, insofar as a thick Cu-base or Ni-base plating layer is formed on the surface of cap 9. In this case, therefore, the aging process is generally unnecessary. Here, paste having a narrow width is intentionally applied. For example, the paste having a cross section of 250 $\mu$m in width and 120 $\mu$m in thickness is applied with pressure. When pressure is applied to the paste thereafter, the thickness of the cross section becomes substantially 1 to 1.5 times the size of Cu balls 1 and, thus, the width of the cross section is increased to about 750 $\mu$m.

Eutectic Sn-0.75Cu solder balls are supplied beforehand to this encapsulated package as external junction terminals 11, while a solder paste is positioned and mounted on a printed circuit board in the same manner as other parts, by printing. Then, the surface mounting is performed by reflow. As a reflow solder, any one of an Sn-3Ag solder (melting point: 221 degrees centigrade; reflow temperature: 250 degrees centigrade), an Sn-0.75Cu solder (melting point: 228 degrees centigrade; reflow temperature: 250 degrees centigrade), Sn-3Ag-0.5Cu solders (melting point: 221–217 degrees centigrade; reflow temperature: 240 degrees centigrade), and the like may be used. In view of the performance records Sn—Pb eutectic soldering which have been obtained in the past, a sufficient strength is ensured between Cu and Cu6Sn5 by the eutectic Sn—Pb solder and there is no possibility that the encapsulated portions or the like will be exfoliated during the reflow operation. Incidentally, when a lap-type joint produced by bonding Cu foil pieces together using this solder paste is subjected to a shearing tensile test (tensile rate: 50 mm/min) at 270 degrees centigrade, a value of about 0.3 kgf/mm is obtained. This reveals that a sufficient strength at high temperatures is ensured in the junction.

When a module whose cap portion is formed of an Al plate that is plated with Ni—Au or is formed of an Fe—Ni plate that is plated with Ni-Au, the growth rate of a Ni—Sn alloy layer at a temperature of not less than 175 degrees centigrade is higher than the growth rate of a Cu—Sn alloy layer, insofar as the Ni-containing layer is formed with a film thickness of about 3 $\mu$m (for example, D. Olsen et al. *Reliability Physics*, 13th Annual Proc., pp 80–86, 1975). A Ni3Sn4 alloy layer is also sufficiently formed by high-temperature aging. However, with respect to the properties of the alloy layer, Cu6Sn5 is superior to the Ni3Sn4 alloy layer. Thus, it is not preferred to make the Ni3Sn4 alloy layer in a substantial thickness. In this case, however, because high-temperature aging cannot last a long time, there is no fear that the Ni3Sn4 alloy layer will grow excessively and cause it to become brittle. From data on an Sn-40Pb solder that has a lower growth rate of alloy layer than that of an Sn alloy layer and that has been used in actual operations for years, it is possible to roughly predict the growth rate of Sn. The growth rate of Sn-40Pb with respect to Ni is not more than 1 $\mu$m even at 280 degrees centigrade for 10 hours. (According to some data, the growth rate is 1 $\mu$m at 170 degrees centigrade for 8 hours). Thus, no problem of brittleness occurs insofar as the high temperature aging is completed in a short time. As regards the growth rate of the alloy layer (Ni3Sn4) of Sn plated with Ni, it is known that the growth rate of the alloy layer differs greatly depending on the type of plating used, such as electroplating and chemical plating and the like. Because it is necessary to maintain high bonding strength, a high growth rate of the alloy layer is desired in the embodiment. On the other hand, data puts the growth rate of Sn-40Pb solder produced by Cu at 1 $\mu$m at 170 degrees centigrade in 6 hours (which corresponds to a growth rate of 1 $\mu$m per one hour at 230 degrees centigrade for the Sn-0.75Cu eutectic solder balls used in the embodiment, on the assumption that the solder balls are simply in a solid state). In a bonding experiment performed at 350 degrees centigrade in 5 seconds, the inventors observed portions where Cu6Sn5 of 5 $\mu$m maximum in thickness were formed between Cu particles. From this fact, it is deemed that no aging process is generally necessary when soldering is performed at a high temperature.

In this paste method, one of the most important tasks is to reduce the occurrence of voids as much as possible. To reduce occurrence of voids, it is important to improve the wettability of the solder for the Cu particles and to improve the fluidity of the solder. To achieve this purpose, the Sn plating on the Cu balls, Sn—Cu solder plating on the Cu balls, Sn—Bi solder plating on the Cu balls Sn—Ag solder plating on the Cu balls, and the use of eutectic Sn-0.7Cu solder balls and addition of Bi to solder balls is effective.

Further, the solder balls are not limited to the Sn solder balls. That is, the solder balls may be eutectic Sn—Cu-base solder balls, eutectic Sn—Ag-base solder balls, eutectic Sn—Ag—Cu-base solder balls or solder balls obtained by adding at least one element selected from In, Zn, Bi, etc., to any one type of these solder balls. Because Sn constitutes the main element of the compositions of these solder balls, any desired compound can be produced. In addition, two or more kinds of solder balls may be mixed. Since the melting points of these solder balls are lower than the melting point of Sn, a tendency of the growth rate of the alloy layer of these balls to be generally fast at high temperatures was observed.

(Embodiment 3)

The paste according to the invention can be also used in die bonding 7 shown in FIG. 2(a). After bonding semiconductor device 13 using the paste according to the invention, cleaning and wire bonding are performed. In the prior art, die bonding uses Au-20Sn bonding. However, in view of reliability of the Au-20Sn solder, use of Au-20Sn solder has been limited to die mounting of small chips. Further, when die bonding is performed using a paste made of a Pb-base solder, a Pb-10Sn solder and the like have been used. The bonding according to the invention is also applicable to chips having a somewhat larger area. The larger the thickness of the bonding portion, the more service life is prolonged and reliability is increased. According to the invention, it is possible to increase this thickness by using high-melting-point balls each having a larger size. When decreasing the thickness, a smaller size of particles (balls) is used. In some bonding methods, it is also possible to form a thick bonding portion while decreasing the particle size. Even the Cu particles having a size of 5–10 μm may be used and particles having a further smaller size may be mixed therewith. The compound that is formed between an Si chip—Cr—Cu—Au, Ni plating, or the like, is provided as a metal layer on the back side thereof—and the Cu ball, as well as between Cu balls and the connection terminal on the substrate, may be either the Sn—Cu compound or the Sn—Ni compound. Since the growth rate of the alloy layer is low, no problem of brittleness occurs.

(Embodiment 4)

The junction provided by a high-temperature solder needs to withstand the temperature only during reflow, which is performed in a succeeding step, and the stress applied to this junction during reflow is considered to be small. Therefore, instead of using the metal balls, one side or both sides of each of connection terminals are roughened so that projections made of Cu, Ni, or the like, may be formed whereby an alloy layer is formed at the contact portions of the projections, and other portions are bonded with a solder. This provides the same effect as with the use of the balls. The solder is applied to one of the terminals using a dispenser, the solder is then melted whereas the projections are forced to encroach on each other by means of a resistance heating body of pulsed electric current, whereby die bonding is performed at a high temperature. As a result, because of the anchor effect of the projections and the formation of the compounds in the contact portions, the contact portions obtain a strength high enough to withstand the stress occurring during reflow. FIG. 3(a) shows a model of the cross section of a junction in which the surface of Cu pad 18 of substrate 19 is roughened by etching 20 and a paste made of Sn-base solder 2 is applied to the roughened surface. In this case, fine Cu particles, or the like, may be added to the Sn-base solder. The back side of terminal portion 75 of a part may be flat. In this case, however, the flat back side is plated with Cu, Ni, or the like, and the surface of the plating is roughened by etching 20. FIG. 3(b) shows a state in which bonding is carried out by heating under pressure, wherein the compound is formed at the contact portions by reflow at a somewhat high temperature so that the contact portion gains strength. Therefore, in the succeeding reflow step, in which the external connection terminals are bonded onto the terminals of the substrate, this portion is not exfoliated.

(Embodiment 5)

Figure 4:
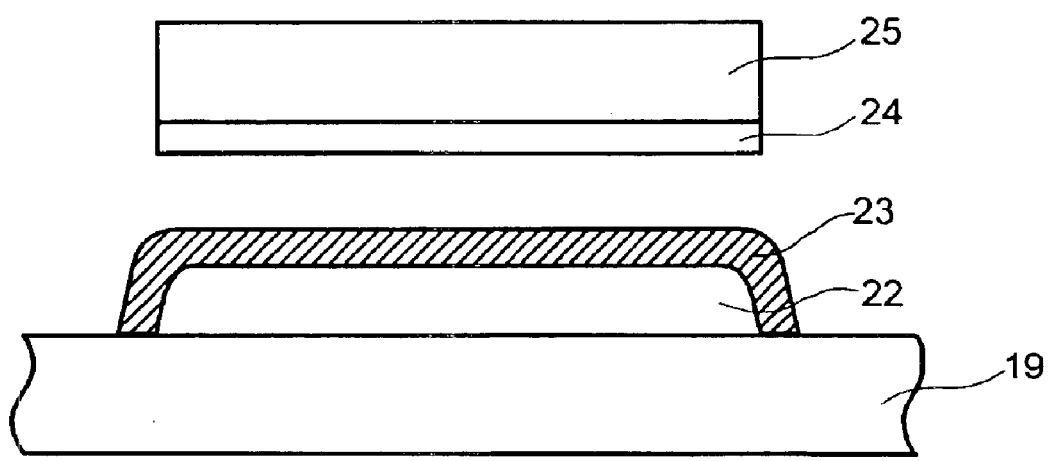
FIG. 4 is a cross-sectional view before bonding in a case where the invention is applied to a plating which can be easily alloyed.

In bonding that uses Au—Sn alloys in which an amount of diffused elements is increased by aging, and the resultant compounds made of these elements change in about three stages from a low- to a high-melting-point side, various compounds are formed at relatively low temperatures within a small range of temperature variation. A well-known composition of the Au—Sn alloy is Au-20Sn (melting point: 280 degrees centigrade, eutectic type). The composition range of Sn in which the eutectic temperature of 280 degrees centigrade is maintained is from about 10 to 37% Sn. The Au—Sn bonding exhibits a tendency to become brittle when the Sn content thereof increases. It is deemed that a composition range that may be realized in an alloy with a low Au content is 55 to 70% Sn, and in this composition range, a 252-degree-centigrade-phase appears (Hansen, *Constitution of Binary Alloys*, McGraw-Hill, 1958). It is thought that the possibility that the temperature of a portion bonded in the preceding step (primary reflow) reaches 252 degrees centigrade after the bonding in a succeeding step (secondary reflow) is low, and thus it is believed that, even in this composition range, the purpose of temperature-hierarchical bonding can be achieved. As regards the compositions, those ranging from AuSn2 to AuSn4 are considered to be formed, and these compounds can be applied to die bonding 7 or to the encapsulation portion of cap 9. For ensuring extra safety, an Au—Sn alloy containing Sn of 50 to 55% may be used. In this alloy, the solidus line and the liquidus line thereof become 309 degrees centigrade and 370 degrees centigrade, at maximum, respectively, so that it becomes possible to prevent the precipitation of the 252-degree-centigradephase. FIG. 4 shows a model of a cross section in which the back side of an Si chip 25 is plated beforehand with Ni(2 μm)-Au(0.1 μm) 24, for example, taps 22 on a lead frame 19 being plated with Ni(2 μm)22-Sn(2–3 μm)23. In die bonding in a nitrogen atmosphere while heating under pressure, and in the aging additionally applied as occasion requires, a portion of Sn is consumed to form the Ni—Sn alloy layer (that is, the Ni—Sn compound layer), and the remainder of Sn forms an Su-Sn alloy layer. Where the Sn content is too high, a low eutectic point (217 degrees centigrade) of Sn and AuSn4 is formed. Therefore, it is necessary to control the Sn content so that this eutectic point may not be formed. Alternatively, a paste in which fine metal particles, Sn and the like, are mixed may be coated thereon. Because die bonding using Au—Sn solders is performed at a high temperature of 350–380 degrees centigrade, it is possible to form a compound in which the Sn content thereof is set lower than that of the AuSn2, by controlling the film thickness, temperature and a period of time, whereby the melting point thereof can be set to be not less than 252 degrees centigrade. Thus, it is considered that no problem occurs in the succeeding reflow process.

As mentioned above, by causing the solder to melt at 300 degrees centigrade, a level considerably higher than the melting point of Sn, the diffusion of the elements is activated and the compounds are formed, whereby the strength required at the high temperature is ensured and the high-reliability bonding thereof on the higher temperature side in the temperature-hierarchical bonding can be realized.

As regards the metal balls described above, it is possible to use any of the balls made of single-element metal (for example, Cu, Ag, Au, Al and Ni), the balls made of alloy (for example, Cu alloy, Cu—Sn alloy and Ni—Sn alloy), the balls made of compounds (for example, Cu6Sn5) compound) and the balls that contain mixtures of the above. That is, it is possible to use any kind of substance in which compounds are formed with molten Sn so that bonding between metal balls can be ensured. Therefore, metal balls are not limited to one type, and two or more types of metal balls may be mixed. These metal balls may be provided with Au plating, Ni/Au plating, single-element Sn plating, or alloy plating containing Sn. Further, resin balls whose surfaces are plated with one kind of plating selected from Ni/Au plating, Ni/Sn plating, Ni/Cu/Sn plating, Cu/Ni plating or Cu/Ni/Au plating may be used. A stress-relieving action can be expected by mixing the resin balls into the solder paste.

Here, provided that the solder includes the metal balls (single-element metal, alloy, compound or the like) having the Ni plating layer, the Au plating layer or the Au plating layer and the Sn balls on the surface thereof, it is possible to obtain a solder bonding portion that exhibits the high reliability of bonding even under reflow conditions in which reflow is performed in air at a temperature that exceeds 240 degrees centigrade.

Further, in this invention, it is also possible to use a solder in which a plating made of Cu or Ni and having a large thickness is formed on a surface of a heat-resistant resin ball and an Au plating is further applied to a surface of the plating made of Cu or Ni. Alternatively, it is also possible to use a solder in which a plating made of Cu or Ni and having a large thickness is formed on a surface of a ball having a low thermal expansion coefficient and an Au plating is further applied to a surface of the plating made of Cu or Ni. The a heat-resistant resin ball is used because the resin has a thermal impact alleviation function so that the enhancement of service life against thermal fatigue after bonding can be expected. On the other hand, the ball having the low thermal expansion coefficient is used because such a ball can lower a thermal expansion coefficient of the solder such that the lowered thermal expansion coefficient approximates a thermal expansion coefficient of a material to be bonded; thus, the enhancement of service life against thermal fatigue after bonding can be expected.

(Embodiment 6)

Next, the use of Al for balls made of other metals is described. In general, high-melting metals are hard, and pure Al is available as a metal that is inexpensive and soft. Pure Al (99.99%) usually does not wet Sn although the metal is soft (Hv 17). However, Sn can be readily wetted by applying Ni/Au plating, Ni/Cu/Au plating, Au plating, Ni/Sn plating, or Ni/Cu/Sn plating to the pure Al. The pure Al readily diffuses at a high temperature in a vacuum. Therefore, by using Sn-base solders containing Ag under some bonding conditions, it is possible to form compounds with Al such as Al—Ag. In this case, the metallization of the Al surface is unnecessary and this provides a great advantage in terms of cost. Trace amounts of Ag, Zn, Cu, Ni and the like may be added to Sn so that Sn reacts readily with Al. The Al surface can be wetted either completely or in spots. In the latter case, which uses spot wetting, when stress is applied to the metal balls, bonding strength is ensured because the restraining force is decreased at the time of deformation; thus, the solder is easily deformed and the unwetted portions absorb energy as friction loss. Therefore, a material excellent in deformability is obtained. It is also possible to apply a plating made of Si, Ni—Sn, Ag, or the like, to an Al wire and then to cut the plated Al wire into particle forms. Al particles can be produced in large amounts at low cost by performing an atomization process, or the like, in a nitrogen atmosphere. It is difficult to produce Al particles without giving rise to surface oxidation. However, even when the surface is once or initially oxidized, oxide films can be removed by a suitable treatment.

Further, taking into consideration the fact that bonding Al balls together is difficult, it is effective to use a solder that contains Al balls and Sn balls therein, wherein the Al balls are formed such that a Ni layer is formed on the surface of the Al ball, a Cu layer of considerable thickness is formed on the Ni layer, a thin Ni layer is further applied to the surface of the Cu layer, and a thin Au layer is applied to the surface of the thin Ni layer. Providing the Cu layer enables formation of Cu—Sn compounds (mainly Cu6Sn5) together with the fused Sn and the Al balls bond to each other due to these Cu—Sn compounds. The Au layer prevents oxidation of the Cu layer.

More specifically, to bond the particles together using the Ni3Sn4 compound, a plating made of Ni(1–5 $\mu$m)/Au(0.1 $\mu$m) may be applied to the surface of the Al ball. Further, to bond the particles to each other using the Cu6Sn5 compound, a plating made of Ni(0.5 $\mu$m)/Cu(3–5 $\mu$m)/Ni (0.3 $\mu$m)/Au(0.1 $\mu$m) may be applied to the surface of the Al ball. Alternatively, to bond the particles to each other using the Au—Su compound, it is possible to apply an Au plating having a considerable thickness of about 3 $\mu$m may be applied to the surface of the Al particle. By bonding the Al particles together using compounds containing a small amount of Sn such as AuSn2, AuSn, and the like, it is possible to obtain bonding that withstands the high temperatures.

The Al balls having the Ni/Au layer, the Ni/Cu/Au layer, the Ni/Cu/Ni/Au layer, or the Au layer on their surfaces and the Sn balls are extremely effective in effecting solder bonding in air and at a temperature $\geq$240 degrees centigrade. Further, since Al is soft compared to Cu, even when the compound formed of Al and Su is hard, the solder that contains Al balls and Sn balls exhibits higher flexibility (a stress-alleviating property) than the solder that contains Cu balls and Sn balls. Accordingly, it has been proved through temperature cycle testing and the like that the solder that contains the balls and Sn balls is effective in the prevention of rupture of a material to be bonded.

(Embodiment 7)

Next, the use of Au balls is described. When Au balls are used, Sn readily wets them; consequently, treatment is unnecessary insofar as bonding performed in a short time is concerned. However, when the soldering time is lengthy, Sn notably diffuses into Al and a concern arises that brittle Au-Sn compounds will form. Accordingly, in order to obtain a soft structure, an In plating, or the like, in which the degree of diffusion to Au is low is effective. In this case, Ni, Ni—Au, or the like, may also be used as a barrier. By making a barrier layer as thin as possible, Au balls become easily deformable. Alternatively, other metallized structures may be adopted insofar as they can suppress the growth of an alloy layer with Au. When bonding takes place in a brief time during die bonding, an alloy layer formed at grain boundaries exhibits a thin thickness so effects attributed to the flexibility of Au can be highly expected even when no barrier is provided. The combination of the Au balls and In solder balls may also be used.

(Embodiment 8)

Next, the use of Ag balls is described. The constitution and advantageous effects obtained by Ag balls are substantially similar to those of Cu balls. In this embodiment, however, since the mechanical properties of Ag3Sn compounds, such as hardness and the like are favorable, it is also possible to perform bonding of Ag particles using the compounds by a common process. It is also possible for Ag balls to be mixed with Cu or the like. A Ni layer and an Au layer also may be formed on the surfaces of Ag balls.

(Embodiment 9)

Next, the use of a metal material as the material of metal balls is described. As representative alloy-base materials, Zn—Al-base and Au—Sn-base materials are available. The melting point of a Zn—Al-base solder is mainly in the range from 330 degrees centigrade to 370 degrees centigrade, which is suitable for hierarchical bonding with Sn—Ag—Cu-base solder, Sn—Ag-base solder, or Sn—Cu-base solder. As representative examples of Zn—Al-base solder, it is possible to use Zn—Al—Mg-base solder, Zn—Al—Mg—Ga based solder, Zn—Al—Ge-base solder, Zn—Al—Mg—Ge-base solder, and any one of these solders which further contains at least one of the metals Sn, In, Ag, Cu, Au, Ni, etc. In the case of Zn—Al-base solder, oxidation occurs intensively and the solder rigidity is high. For these reasons, cracks may occur in Si chips when Si chips are bonded (Shimizu et al.: "Zn—Al—Mg—Ga Alloys for Pb-Free Solders for Die Attachment," *Mate* 99, 1999). Thus, these problems must be solved when the Zn—Al-base solder is used for metal balls.

Accordingly, to lower the rigidity of the solders, heat-resistant plastic balls plated with Ni/solder, Ni/Cu/solder, Ni/Ag/solder or Au are uniformly dispersed in the Zn—Al-base balls to lower Young's modulus. It is preferred that these dispersed particles have a particle size smaller than a particle size of the Zn—Al-base balls and that they are uniformly dispersed among the Zn—Al-base balls. When the solder deforms, the elastic, soft plastic balls having a size of about 1 μm also deform so that the solder obtains a great advantageous effect with respect to the relieving the thermal impact and the mechanical impact. When rubber is dispersed in the Zn—Al-base solder balls, Young's modulus decreases. Since the plastic balls are almost uniformly dispersed among the Zn—Al-base solder balls, this uniform dispersion is not greatly weakened when melting is completed in a short time. Further, by using plastic balls whose thermal decomposition temperature is about 400 degrees centigrade, the organic substances of the plastic can be prevented from decomposing in the solder during bonding using a resistance heating body.

Zn—Al is liable to be readily oxidized. Thus, for storing the compound, it is preferred that surfaces of Zn—Al balls be plated with Sn, which is formed by replacing Cu. The Sn and Cu dissolve in the Zn—Al solder during bonding insofar as amounts of Sn and Cu are small. Because of the presence of Sn on the surfaces of Zn—Al balls, bonding of Sn onto a Ni/Au plating formed on a Cu stem, for example, is facilitated. At a high temperature not less than 200 degrees centigrade, the growth rate of a Ni—Sn alloy layer (Ni3Sn4) is greater than that of Cu6Sn5; thus, there is no possibility that bonding is impossible due to the insufficient formation of the compounds.

Further, by mixing Sn balls of 5–50% into the solder in addition to the plastic balls, Sn layers infiltrate among the Zn—Al-base solders. In this case, portions of the Sn layers serve for the direct bonding of Zn—Al balls to each other. However, the other portions of the Sn layers constitute the relatively soft Sn—Zn phase having a low melting point and the residual Sn and the like that are present in Zn—Al-base solders. Accordingly, any deformation can be absorbed by the Sn, the Sn—Zn phase and the rubber of the plastic balls. In particular, because of a combined action of the plastic balls and the Sn layers, the further relieving of rigidity can be expected. Even in this case, the solidus line temperature of the Zn—Al-base solder is ensured to be not less than 280 degrees centigrade so that there is no problem with respect to the strength required at high temperatures.

By applying Sn plating to the Zn—Al-base solder balls to intentionally leave a Sn portion that is not dissolved in the balls, the Sn portion absorbs the deformation so that the rigidity of the Zn—Al solder balls can be relieved. In order to further relieve the rigidity, Zn—Al-base solder balls may be used while mixing in plastic balls having a size of about 1 μm, which are coated by metallizing and soldering. Accordingly, the impact resistance of the Zn—Al base solder balls is improved and the Young's modulus thereof decreases. Alternatively, by using a paste in which balls made of Sn, In, or the like, the Sn-plated plastic balls or rubber are dispersed into the Zn—Al-base solder balls (for example, Zn—Al—Mg, Zn—Al—Ge, Zn—Al—Mg—Ge or Zn—Al—Mg—Ga solder balls), it is possible to similarly improve the temperature cycle resistance and the impact resistance, whereby the high reliability of the solder paste can be ensured. When only the Zn—Al-base solders are used, the balls are hard (about Hv 120–160) and the rigidity is great so that concern arises that a Si chip of a large size will be broken. To—allay this concern, soft Sn layers or In layers having a low-melting point Sn are partially arranged around the balls, and rubber is dispersed around the balls, ensuring deformability and decreasing rigidity.

(Embodiment 10)

FIG. 5(a) to FIG. 5(c) show an example in which a relatively small output module, or the like, used for signal-processing in portable cellular phones, which module has such a large square shape that one side thereof is larger than 15 mm in length, is mounted to a printed circuit board by a flat-pack type package structure in which the difference in the thermal expansion coefficient between the module and the substrate is relieved by leads. In this type of structure, it is usual to use a system where the rear face of each of circuit element is die-bonded to a junction substrate having excellent thermal conductivity, and the circuit elements are connected to the terminal of the junction substrate by wire bonding. With respect to this system, there are many examples in which a MCM (multi-chip module) design is used where several chips and chip parts such as resistors and capacitors are arranged around each of the chips. A conventional HIC (hybrid IC), power MOSIC and the like are representative examples. Available module substrate material includes an Si thin-film substrate, an AlN substrate having a low thermal expansion coefficient and high thermal conductivity, a glass ceramic substrate with a low thermal expansion coefficient, an $Al_2O_3$ substrate whose coefficient of thermal expansion is close to that of GaAs, and a metal-core organic substrate of Cu or the like, which has high heat resistance and improved thermal conduction.

FIG. 5(a) shows an example in which Si chips 8 are mounted on an Si substrate 35. Since resistors, capacitors and the like can be formed of thin films on Si substrate 35, higher density mounting is possible. In this example, a flip chip mounting structure of Si chips 8 is shown. It is also possible to adopt a system in which the Si chips are bonded by die bonding while the terminals are connected by wire bonding. FIG. 5(b) shows another example in which the mounting of parts on printed circuit board 49 is of a QFP-LSI type module structure and soft Cu-base leads 29 are used. It is typical to perform metallizing of the Cu leads 29 using Ni/Pd, Ni/Pd/Au, Ni/Sn, or the like. The bonding of leads 29 and Si substrate 35 is performed by heating under pressure using the paste according to the invention. As regards leads 29, it is possible to adopt a method in which the leads are supplied as a straight line on a row of terminals using a dispenser, or a method in which the supply of the material thereof is carried out by printing, with respect to each of the terminals, and the leads are formed by separation thereof, corresponding to individual terminals, through heating under pressure. The Au or Cu bumps 18 of respective Si chips 8 are bonded by supplying the paste according to the invention to junction substrate 35. Alternatively, it is possible to accomplish Au—Sn bonding or Cu—Sn bonding by applying an Sn plating to the terminals located on the substrate side. Furthermore, as still another bonding method, where Au ball bumps are used and Sn-plated terminals are provided on the substrate, Au—Sn bonding is obtained by a thermocompression bonding technique so that resultant junctions can adequately withstand a reflow temperature of 250 degrees centigrade. It is also possible to use a heat-resistant, electrically conductive paste. For the protection of the chips, each of the chips has a silicone gel 26, an epoxy resin containing a filler and/or a rubber such as a silicone and having a low thermal expansion coefficient and flexibility of a certain level while maintaining a flowability and a mechanical strength after setting, or only a silicone resin, thereby making it possible to protect and reinforce the chips including the terminal portions of the leads. This enables realization of the greatly desired lead-free bonding by temperature hierarchy.

When a thick film substrate such as an AlN substrate, a glass ceramic substrate or an $Al_2O_3$ substrate is used in place of the Si substrate, the resistors, capacitors, and the like, are basically mounted as chip parts. Further, it is possible to use a forming method in which laser trimming is performed while using a thick-film paste. When resistors and capacitors are formed of a thick film paste, it is possible to use the same mounting system as for the above-mentioned Si substrate.

FIG. 5(b) shows another system comprising the steps of mounting chips 8 made of Si or GaAs, each with its face up, on an $Al_2O_3$ substrate 19 having excellent thermal conductivity and mechanical properties, by bonding the chips onto the substrate under pressure by means of a pulse-resistance heating body, then reflow bonding the chip parts, cleaning them, and executing the wire bonding. In this case, resin encapsulation is a general practice in the same manner as the example discussed in conjunction with FIG. 5(a). The resin 26 used here, as in the case of FIG. 5(a), is an epoxy resin of low thermal expansion coefficient in which a quartz filler and rubber such as a silicone rubber are dispersed, and which can reduce thermal impact, or a silicone resin, or a resin in which both the epoxy resin and the silicone resin are mixed in some states or forms. In this system, a large substrate in an undivided state is used until the mounting of the chips and the chip parts is completed; then the large substrate is divided, and each of the divided portions is covered with a resin after bonding the leads. The coefficients of thermal expansion of GaAs and $Al_2O_3$ are close to each other, the solder paste of the invention contains about 50% Cu, and bonding is performed through the structure of the bonded Cu particles; thus, the structure has excellent thermal conductivity. To further improve the heat dissipation, thermal vias are provided under the metal layer formed immediately below chip 8, thereby making it possible to also dissipate heat from the back side of substrate 19. The paste according to the invention is supplied to these terminals by printing or using a dispenser. The paste according to the invention can be also used in solder junctions 33 that provide bonding between leads 29 and $Al_2O_3$ substrate 19.

In the case of the bonding of Al fins, if a non-cleaning type is possible, a system can be used comprising the steps of supplying the paste in a shape surrounding the fins by means of a dispenser or printing, and performing bonding under pressure using the resistance heating body, a laser, a light beam, or the like, or by bonding in one operation simultaneously with the chip parts by reflow. Al materials are plated with Ni or the like. In the case of the fin bonding, in order to realize the non-cleaning type, Al is formed into a foil shape and the foil thus obtained is bonded under pressure in a N2 atmosphere by means of the resistance heating body.

FIG. 5(c) shows a part of a module structure in which electronic parts are mounted on a metal-core substrate having a metal 39 therein and are encapsulated with an Al fin 31. A chip 13 may have a face-down structure and may be directly bonded to metal 39 of the metal core substrate by installing dummy terminals 45 for heat dissipation. The bonding is performed by LGA (lead grid array) system, the pads (electrodes) of a chip-side being made of Ni/Au or Ag/-Pt/Ni/Au, the pads (electrodes) of a substrate-side being made of Cu/Ni/Au, and these are bonded to each other using the paste according to the invention. When using a polyimide substrate that has a low thermal expansion and a heat-resisting property, or when using a built-up substrate similarly having a heat resisting property, module mounting through temperature hierarchy can be performed in which semiconductor devices 13 are directly mounted using a paste 36 according to the invention. In the case of a chip with high heat generation, it is also possible for the heat to be conducted to metal 39 through the thermal vias. Since in each of the thermal vias, Cu particles which contact each other are present and thus the heat is instantaneously conducted to the metal. That is, this structure has excellent thermal conductivity. In this case, with respect to the portions where cap 31 is bonded, bonding is performed using paste 31 according to the invention. Paste portions 36 can be printed in one operation.

In an example of applying the embodiment to a circuit element, the RF module is described above. However, the invention can also be applied to any one of an SAW (surface acoustic wave) device structure used as a band pass filter for various types of mobile communication equipment, a PA (high-frequency power amplifier) module, a module for monitoring a lithium cell, and other modules and circuit elements. The product field in which the solder of the invention can be applied is neither limited to portable cellular phones, including mobile products, nor to notebook personal computers, or the like. That is, the solder of the present invention can be applied to module-mounting parts capable of being used in new household appliances and the like in this digitization age. Needless to say, the solder according to the invention can be used for temperature-hierarchical bonding using a Pb-free solder.

(Embodiment 11)

Figure 6:
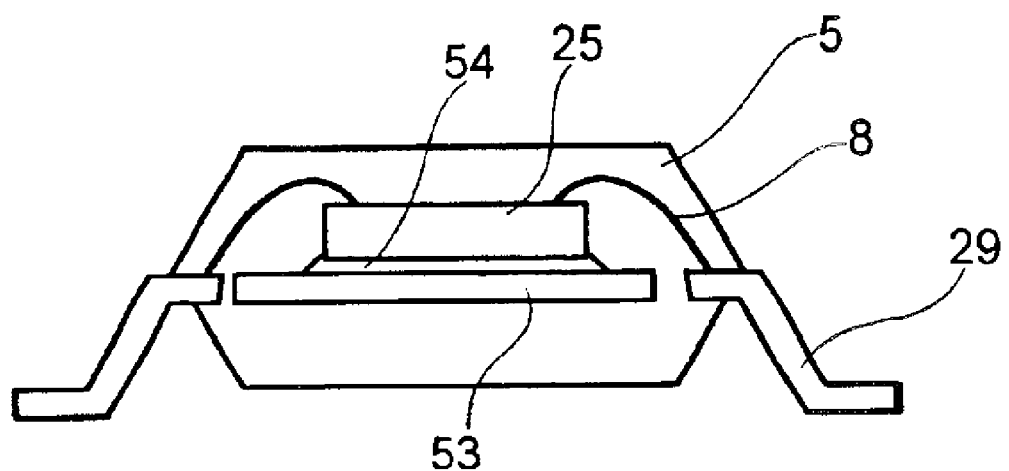
FIG. 6 is a cross-sectional view of a model of a plastic package.

FIG. 6 shows an example of the application of the invention to a typical plastic package. Conventionally, a rear face of an Si chip 25 is bonded to a tab 53 made of a 42 alloy using an electrically-conductive paste 54. The circuit element is connected to respective leads 29 by wire bonding while using gold wires 8, or the like, and is molded with a resin 5. Then, Sn-base plating is applied to the leads corresponding to the Pb-free bonding design. Conventionally, a eutectic Sn-37Pb solder with a melting point of 183 degrees centigrade was used for mounting on printed circuit boards, and, therefore, it was possible to perform reflow bonding at 220 degrees centigrade, maximum. However, in the case of the Pb-free bonding, since reflow bonding is performed using the Sn-3Ag-0.5Cu solder (melting point: 221–217 degrees centigrade), the reflow temperature reaches about 240 degrees centigrade, that is, the maximum temperature becomes higher by about 20 degrees centigrade than that of the conventional technique. Thus, insofar as a conventionally used heat-resistant, electrically-conductive paste made of 42-Alloy used for bonding between Si chip 25 and tab 53 is concerned, the bonding strength at a high temperature decreases, and the concern arises that the reliability of the bonding is adversely affected. Therefore, by using the paste according to the invention in place of the electrically-conductive paste, it becomes possible to perform Pb-free bonding at about 290 degrees centigrade with respect to the die bonding. This application for a plastic package can be applied in all plastic package structures in which an Si chip and a tab are bonded together. As for the shape of the leads, structurally there are the gull wing type, the flat type, the J-lead type, the butt-lead type and the leadless type. The invention can be applied to all of these types.

(Embodiment 12)

Figure 7:
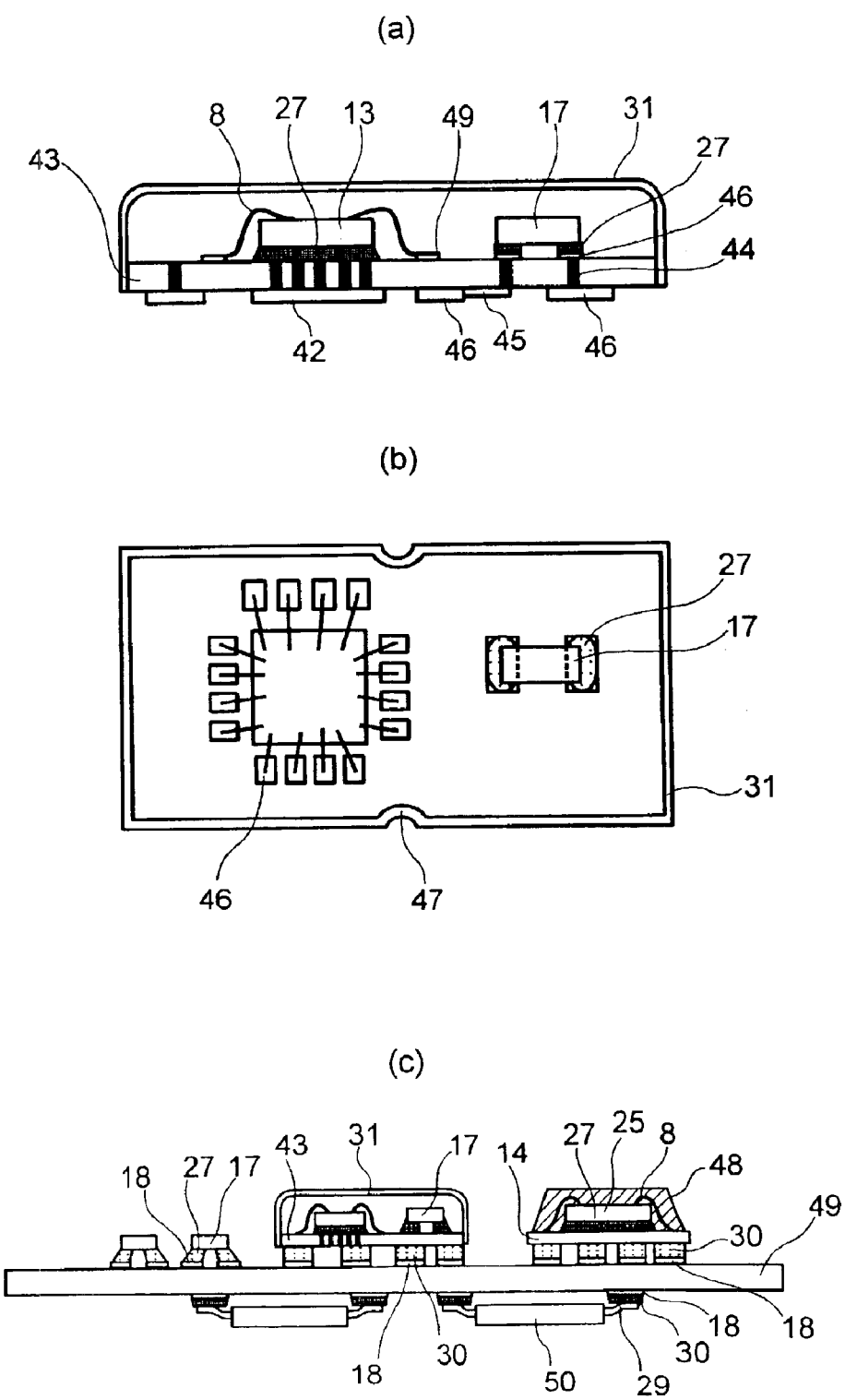
FIG. 7(a) to 7(c) are cross-sectional views of a model of mounting an RF module.

FIG. 7(a) to FIG. 7(c) show a more specific example in which the invention is applied to mounting of RF modules for high frequencies. FIG. 7(a) is a cross-sectional view of the module and FIG. 7(b) is a plan view of the module in which an Al fin 31 on the top face is removed.

In an actual structure, several MOSFET elements each comprising a radio-wave-generating chip 13, 1×1.5 mm in size, are mounted with face-up bonding to adapt to multi-band design. In addition, parts 17 such as resistors and capacitors, around the MOSFET parts form a high-frequency circuit for efficiently generating the radio waves. Chip parts are also miniaturized and 1005, 0603, and the like, are used. The module is about 7 mm long and about 14 mm wide and is miniaturized with high-density mounting.

In this embodiment, only the functional aspect of the solder is taken into consideration, and there is described a model in which one circuit element and one chip part are mounted as the representatives thereof. In this case, chip 13 and chip part 17 are bonded to a substrate 43 by the solder paste according to the invention. The terminals of the Si (or GaAs) chip 13 are bonded to the pads (electrodes) of the substrate 43 by wire bonding 8, and, in addition, are electrically connected by through holes 44 and an interconnector 45 to terminals 46 that provide the external connection portion on the rear face of the substrate. Chip part 17 is solder-bonded to the pads of the substrate and is further electrically connected by through holes 44 and interconnector 45 to terminals 46 that provide the external connection portion on the rear face of the substrate. Chip 13 is often coated with a silicone gel (omitted in this figure). Under chip 13, thermal vias 44, are provided for heat dissipation and are guided to a terminal 42 for heat dissipation on the rear face. In the case of a ceramic substrate, the thermal vias are filled with a thick-film paste of a Cu-base material having excellent thermal conductivity. When an organic substrate that is relatively inferior in heat resistance is used, by using the paste according to the invention it is possible to perform soldering in the range of 250 degrees centigrade to 290 degrees centigrade for bonding the rear face of the chip, bonding the chip parts, and for use in thermal vias, or the like. Furthermore, Al fins 31 covering the whole module and substrate 43 are fixed together by caulking or the like. This module is mounted by solder-bonding terminals 46, which provide an external connection to the printed circuit board or the like, and, in this case, temperature-hierarchical bonding is required.

FIG. 7(c) shows an example in which, besides this RF module, a semiconductor device of BGA type and a chip part 17 are mounted on a printed circuit board 49. In the semiconductor device, a semiconductor chip 25 is bonded, face-up, to a junction substrate 14 using the solder paste according to the invention. The terminals of semiconductor chip 25 and the terminals of junction substrate 14 are bonded together by wire bonding, and the areas around the bonding portions are resin-encapsulated. For example, semiconductor chip 25 is die-bonded to junction substrate 14, using the resistance heating body, by melting the solder paste at 290 degrees centigrade for 5 seconds. Further, on the rear face of junction substrate 14, solder ball terminals 30 are formed. For example, a Sn-3Ag-0.5Cu solder is used in solder ball terminals 30. Moreover, a semiconductor device (in this example, TSOP-LSI), is also solder bonded to the rear face of substrate 49, and this is an example of so-called double-sided mounting.

As a method of the double-sided mounting, for example, a Sn-3Ag-0.5Cu solder paste is first printed in pad portions 18 on printed circuit board 49. Then, to perform solder bonding from the side of the mounting face of a semiconductor device such as TSOP-LSI 50, TSOP-LSI 50 is located and reflow bonding thereof is performed at 240 degrees centigrade, maximum. Next, chip parts 17, a module and a semiconductor are located and reflow bonding thereof is performed at 240 degrees centigrade, maximum, whereby double-sided mounting is realized. It is usual to first perform reflow bonding with respect to light parts having heat resistance and then to the bond of heavy parts that have no heat resistance. In reflow bonding at a later stage, it is necessary that the solder of the first bonded parts is not allowed to fail, and it is ideal to prevent the solder from being remelted.

In the case of reflow and double-sided mounting by reflow, the temperature of the joints already mounted on the rear face exceeds the melting point of the solder. However, in most cases, there is no problem when the mounted parts do not fall off. In the case of reflow, the temperature difference between the upper and lower faces of the substrate is small, so that the warp of the substrate is small and light parts do not fall because of the action of the surface tension even if the solder is melted. Although the combination of the Cu balls and Sn is described above in the representative examples for mounting RF modules and BGA-type semiconductors according to the invention, the invention is similarly applicable to other combinations recited in the claims.

(Embodiment 13)

Next, a way to further reduce the cost of an RF module through a resin encapsulation method using the paste according to the invention is described below. FIG. 8(a) shows the RF module assembling steps of the resin encapsulation method and FIG. 8(b) shows the secondary mounting and assembling steps for mounting a module on a printed circuit board. FIG. 9(a) to FIG. 9(d) are sectional model drawings in which the sequence of assembling in the RF module assembling steps of FIG. 8(a) is shown. The size of an $Al_2O_3$ multilayer ceramic substrate 43 of a square shape is as large as 100 to 150 mm on one side, and $Al_2O_3$ multilayer ceramic substrate 43 is provided with slits 62 for breaking apart the large substrate into respective module substrates. Cavities 61 are formed in the position where each of Si chips 13 on $Al_2O_3$ multilayer ceramic substrate 43 is to be die-bonded, and each of the surfaces of the cavities 61 is plated with a thick-Cu-film/Ni/Au or Ag—Pi/Ni/Au. Just under the die-bond a plurality of thermal vias 44 (filled with Cu thick-film conductors, etc.) are formed, which are connected to pads 45 formed on the back side of the substrate to thereby dissipate heat through a multilayer printed circuit board 49 (FIG. 9(d)). This enables the heat generated from a high-output chip of several watts to be smoothly dissipated. An Ag—Pt thick-film conductor was used to form the pad materials of $Al_2O_3$ multilayer substrate 43. Alternatively, a Cu thick-film conductor may be used depending on the type and the fabrication method of the junction substrate ($Al_2O_3$ in this example), or it is possible to use a W—Ni conductor or Ag—Pd conductor. The pad portions, in each of which a chip part is mounted, are made thickly plated Ag—Pt-film/Ni/Au. As regards the pads formed on the rear face of the Si chip, the thin film of Ti/Ni/Au is used. However, the pads are not limited to this structure, and a thin film of Cr/Ni/Au, etc., such as those conventionally used can also be used as pads.

Figure 9:
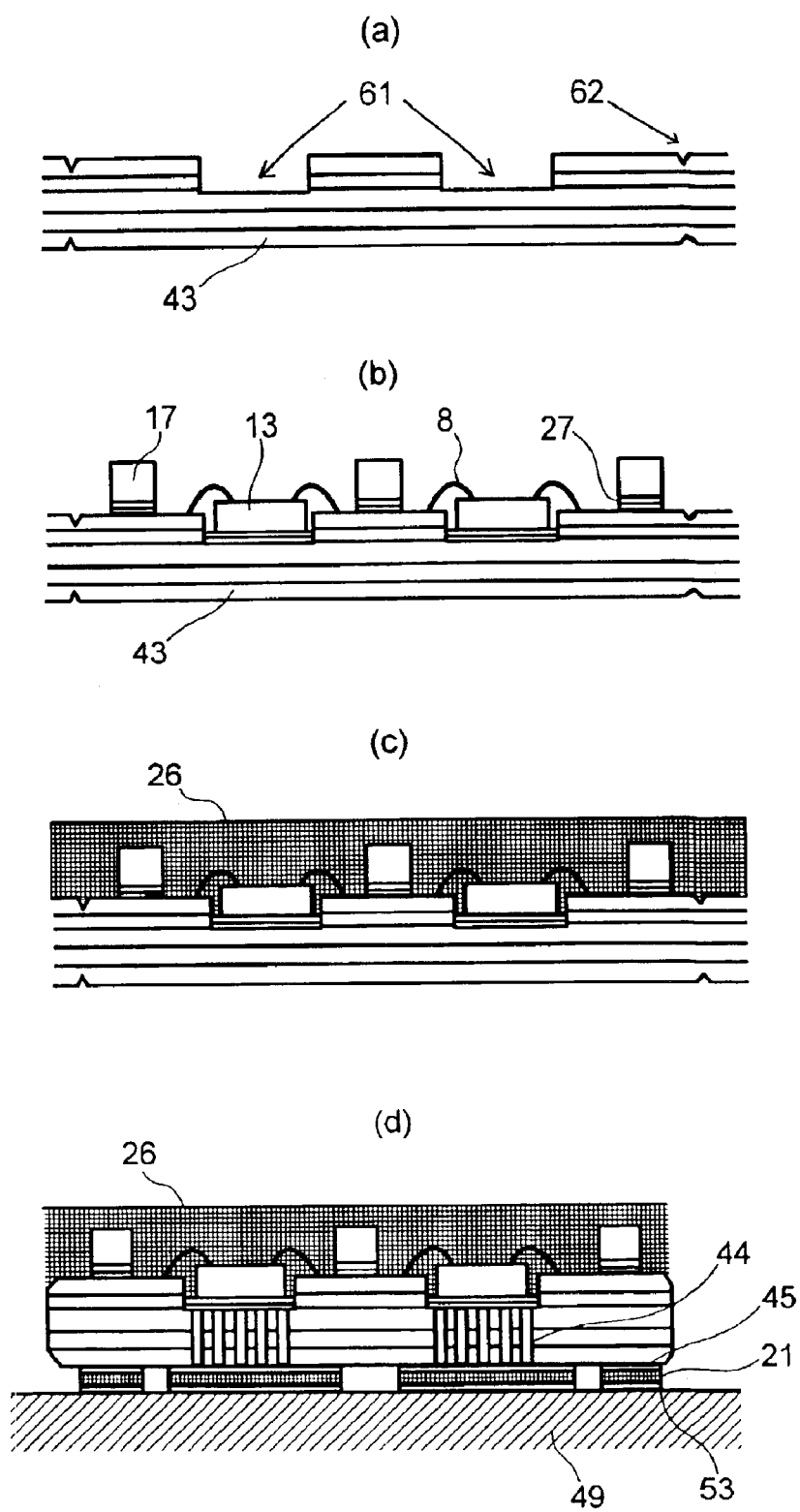
FIG. 9(a) to FIG. 9(d) are cross-sectional views of a model of process sequence of an RF module.
Figure 10:
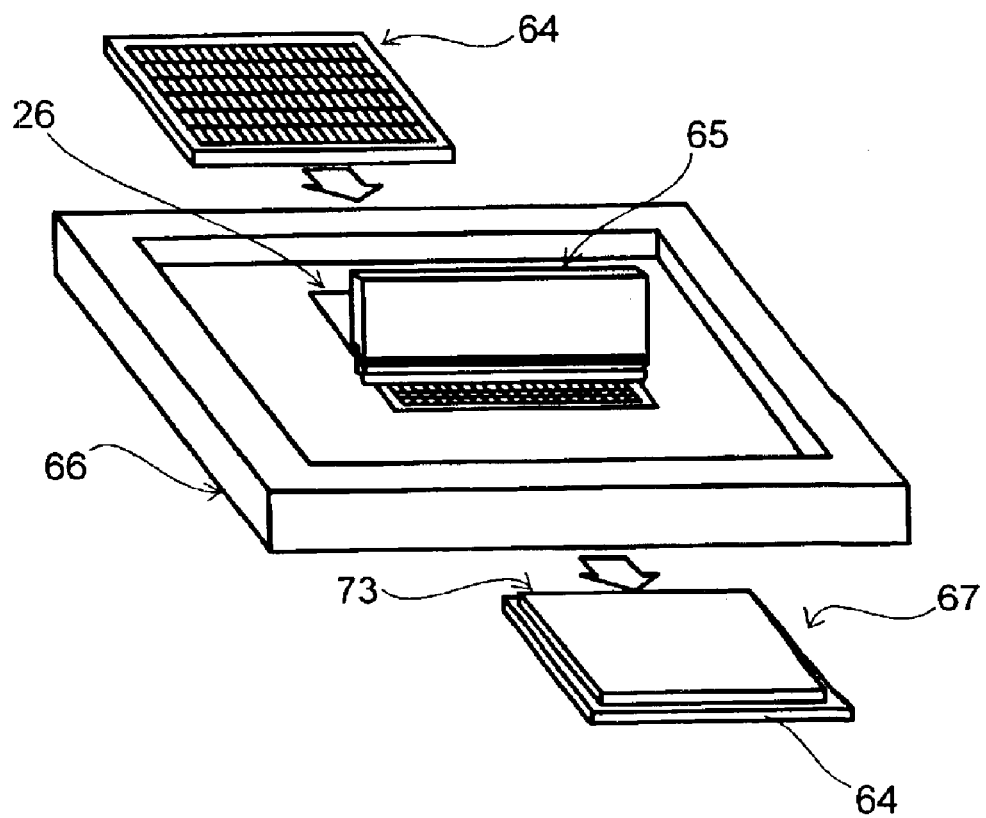
FIG. 10 is a perspective view of the mounting state of an RF module on a mounting substrate.
Figure 11:
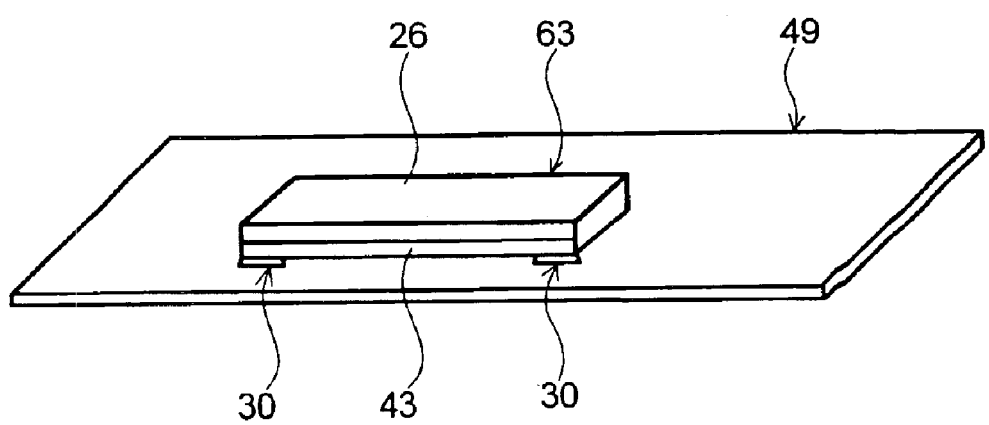
FIG. 11 is perspective view of a method of resin printing in the assembling of an RF module.

After the die bonding of Si chip 13 and the reflow of chip part 17 (which will be described later in detail), wire bonding 8 is performed after cleaning the $Al_2O_3$ multilayer substrate (FIG. 9(*b*)). Further, a resin is supplied thereto by printing and the section shown in FIG. 9(*c*) is obtained. The resin, which is a silicone resin or low-elasticity epoxy resin, is printed by means of a squeegee 65, as shown in FIG. 10, to cover $Al_2O_3$ multilayer substrate 43 with the resin in one operation, whereby a single-operation encapusulated portion 73 is formed on $Al_2O_3$ multilayer substrate 43. After the setting or curing of the resin, identification marks are inscribed by a laser or the like, and a check of characteristics is conducted after the dividing the substrate. FIG. 11 is a perspective view of a module that was completed by the steps of dividing $Al_2O_3$ multilayer substrate 43, mounting it on a printed circuit board and performing the reflow thereof. The module is has an LGA structure so that it becomes possible to perform high-density mounting on a printed circuit board.

Next, the above description is supplemented by referring to the sequence of steps for RF module assembly shown in FIG. 8(*a*). The paste according to the invention is supplied to the chip part by printing, and this paste is supplied by means of a dispenser with respect to chips 13 to be mounted on the cavities. First, passive devices 17 such as chip resistors, chip capacitors and the like are mounted. Next, the 1 mm×1.5 mm chip 13 is mounted and, at the same time, die bonding thereof is performed by lightly and uniformly pressing Si chip 13 by means of a heating body at 290 degrees centigrade to thereby perform the leveling thereof. Die bonding of the Si chip and reflow of the chip parts 17 are done in a series of steps, mainly by the heating body located under the $Al_2O_3$ multilayer substrate. To eliminate voids, Sn-plated Cu balls are used. At 290 degrees centigrade, the Cu balls are softened a little and Sn improves fluidity at the high temperatures, thereby activating the reaction between Cu and Ni. In this case, the compound is formed in contact portions where Cu particles are in contact with each other and where Cu particles and metallized portions are in contact with each other. Once the compounds are formed, they do not remelt even at the secondary reflow temperature of 250 degrees centigrade because of their high melting points. Further, because the die boding temperature is higher than the secondary reflow temperature, Sn wets and spreads out sufficiently to thereby become the compound. As a result thereof, during secondary reflow, the compound layers come to provide sufficient strength at high temperatures, so that the Si does not move even in the resin-encapsulated structure. Further, even in a case where the low-melting point Sn remelts, it does not flow out, even at a temperature of 250 degrees centigrade because it has already been subjected to the heat history of the higher temperatures. For these reasons, the Si chip remains stationary during secondary reflow, and the module characteristics are not affected by the remelting of Sn.

Next, influences of the resin are described by comparing the use of the paste according to the invention with that of conventional Pb-base solder (which makes it possible to perform reflow at 290 degrees centigrade).

In FIG. 12(*a*) and FIG. 12(*b*), there is shown an example of a phenomenon of a short circuit caused in chip part 17 by the flowing-out 71 of a conventional Pb-base solder (having a solidus line temperature of 245 degrees centigrade) in a case where secondary reflow (220 degrees centigrade) for bonding to a printed circuit board is performed (which is similar to the mounting state of FIG. 11 and the composition of solder 30 is an Sn—Pb eutectic). In the case of the module encapsulated by a filler-containing, high-elasticity epoxy resin 68 (that is, in the case of a chip part plated with Sn or Sn—Pb, which is usually used for metallizing, the melting point at which this solder remelts decreases to about 180 degrees centigrade because of the formation of a eutectic phase of the Sn—Pb), the short circuit is caused under the pressure of this resin, the modulus of elasticity of the resin at 180 degrees centigrade at which the solder flows out being 1000 MPa. Although the melting point of the Pb-base solder is originally the solidus line temperature of 245 degrees centigrade, it decreases to about 180 degrees centigrade because the pads of the chip part are plated with Sn—Pb solder and because the substrate side is plated with Au. Therefore, the Pb-base solder is in a remelted state during secondary reflow (220 degrees centigrade). When the Pb-base solder changes from solid to liquid, a volume expansion of 3.6% occurs abruptly in the solder. Both the remelting expansion pressure 70 of Pb-base solder 76 that forms a fillet on the side of the chip part and the resin pressure 69 balance each other with a large force and exfoliate the interface formed between the top surface of the chip and the resin, which is a structurally weak portion, causing the solder to flow out 71. As a result, short circuits to the pads on the opposite side occur at a high probability (70%). It was also found that the incidence of this short-circuit phenomenon can be reduced by lowering the modulus of elasticity of a resin defined at a high temperature (180 degrees centigrade). Since there is a limit as regards the softening of epoxy resins, the research was made such that the modulus of elasticity increased by adding a filler, or the like, to a soft silicone resin. As a result, it was found that the flow-out 71 of the solder will not occur when the elastic modulus at 180 degrees centigrade is not more than 10 MPa. When the modulus of elasticity is increased to 200 MPa at 180 degrees centigrade, short circuits occur at a probability of 2%. In view of the foregoing, it is necessary that, in a solder structure which remelts, the modulus of elasticity of the resin is not more than 200 MPa at 180 degrees centigrade.

In FIG. 13, the influence caused by the outflow with respect to the paste structure of the present invention is shown, while comparing it with a conventional solder. As described above, when bonding is performed using the paste according to the invention, the volume occupied by the Sn in the molten portion is about a half and, partly because the expansion value of Sn itself is small, the volume expansion ratio of the solder assumes a low value of 1.4% which is 1/2.6 times that of the Pb-base solder. Further, as illustrated by the example shown in FIG. 13, the Cu particles are bonded together in a point-contact state, the pressure of the resin is balanced by the reaction of the constrained Cu particles even, so that no crushing of the soldered portion occurs; that is, a phenomenon quite different from the case of the molten solder is expected. It is expected that the probability of the occurrence of the short circuits between pads (electrodes) due to outflow of Sn is low. Thus, the outflow of solder can be prevented even with an epoxy resin, which is designed such that it becomes somewhat soft even when a filler is added. From the result of FIG. 13, in assuming that the complete melting of Sn occurs and that a modulus of elasticity of the resin that is in inverse proportion to the volume expansion ratio is allowed, the allowable modulus of elasticity of the resin becomes 500 MPa. Actually, the effect of the reaction of Cu particles can be expected, so that it is projected that no outflow will occur even with a resin having a high modulus of elasticity. In a case where the use of an epoxy resin is possible, the dividing of a substrate can be mechanically performed, and it becomes unnecessary to make cuts in the resin by means of a laser etc., so that productivity and efficiency are also improved.

The above-mentioned module mounting can also be applied to other ceramic substrates, organic metal-core substrates and built-up substrates. Furthermore, the chip element can be bonded both in a face-up manner and in a face-down manner. As regards the module, the invention can also be applied to surface-acoustic-wave (SAW) modules, power MOSIC modules, memory modules, multi-chip modules and the like.

(Embodiment 14)

Next, an example of application of the invention to the resin package of a high-output chip such as a motor-driver IC is described. FIG. 14($a$) is a plan view of a high-output resin package in which a lead frame 51 and a thermal-diffusion plate 52 are bonded together and caulked. FIG. 14($b$) is a cross-sectional view of the package. FIG. 14($c$) is a partially enlarged view of a circle portion in FIG. 14($b$). In this example, a semiconductor chip 25 is bonded to a thermal-diffusion plate (heat sink) 52 using the solder paste according to the invention. The lead 51 and the terminals of semiconductor chip 25 are bonded together by wire bonding 8 and are resin-encapsulated. The lead is made of a Cu-base material.

Figure 15:
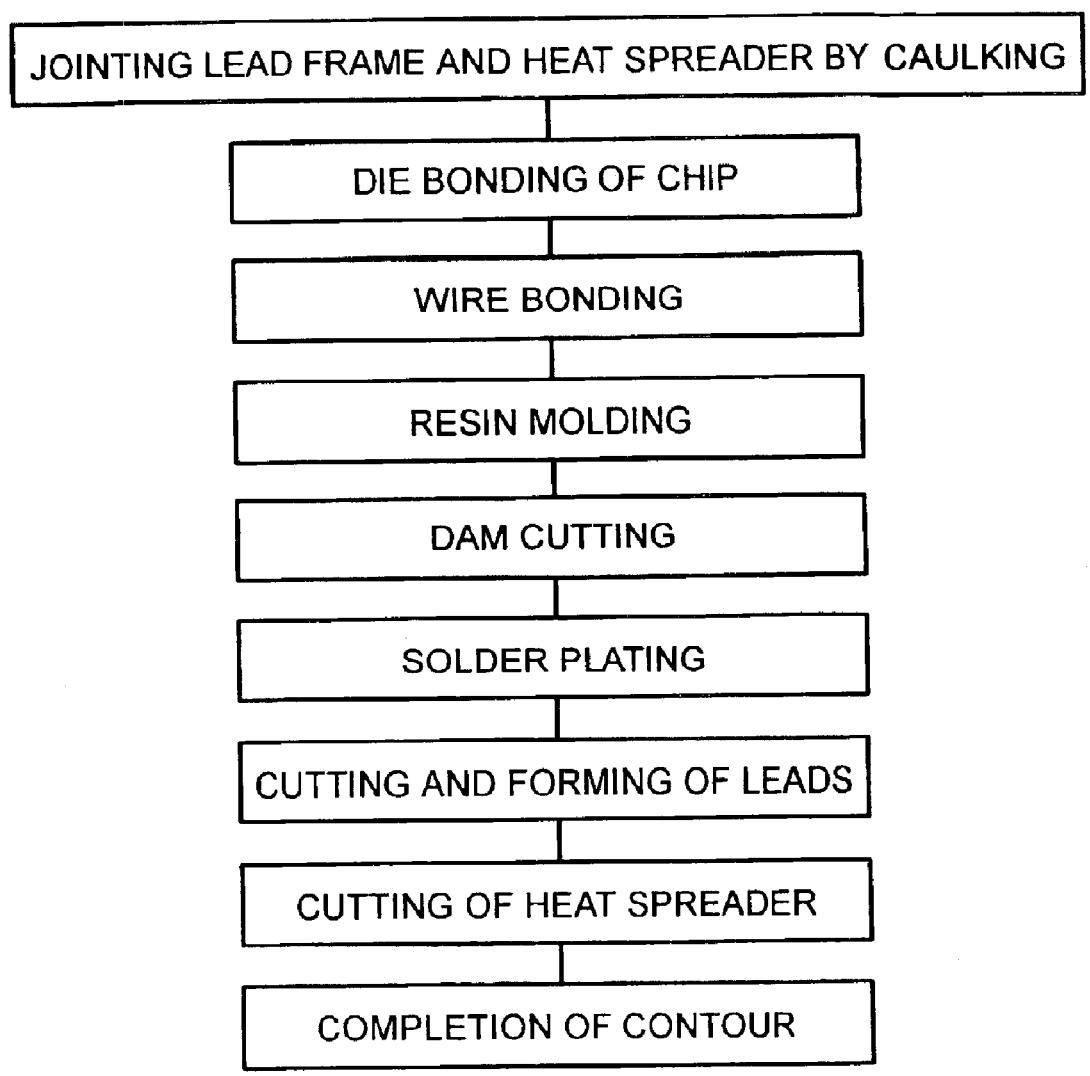
FIG. 15 is a flow chart of the process of a high-output resin package.

FIG. 15 is a flow chart of the steps of the high-output resin package. First, a semiconductor chip 25 is die-bonded onto the lead frame 51 and the thermal-diffusion plate 52—both joined by caulking—by supplying a solder paste 3. Semiconductor chip 25 bonded by die bonding is further wire bonded, as shown in the drawing, by means of the lead 51, a gold wire 8, and the like. Subsequently, resin encapsulation is performed and Sn-base solder plating is carried out after the dam cutting. Then, lead cutting and lead forming are performed and the cutting of the thermal-diffusion plate is done, whereby the package is completed. The back-side pads of the Si chip can be metallized by a material usually used, such as Cr—Ni—Au, Cr—Cu—Au or Ti—Pt—Au. Even in when the Au content is substantial, good results are obtained insofar as an Au-rich compound having a high Au—Sn melting point being formed. As regards die bonding, it is carried out using a resistance heating body with an initial pressure of 1 kgf, at 300 degrees centigrade for 5 seconds, by printing, after the solder is supplied. For a large chip, it is preferred that, in the case of an especially hard Zn—Al-base solder, high reliability is ensured by adding rubber and a low-expansion filler.

(Embodiment 15)

Figure 16:
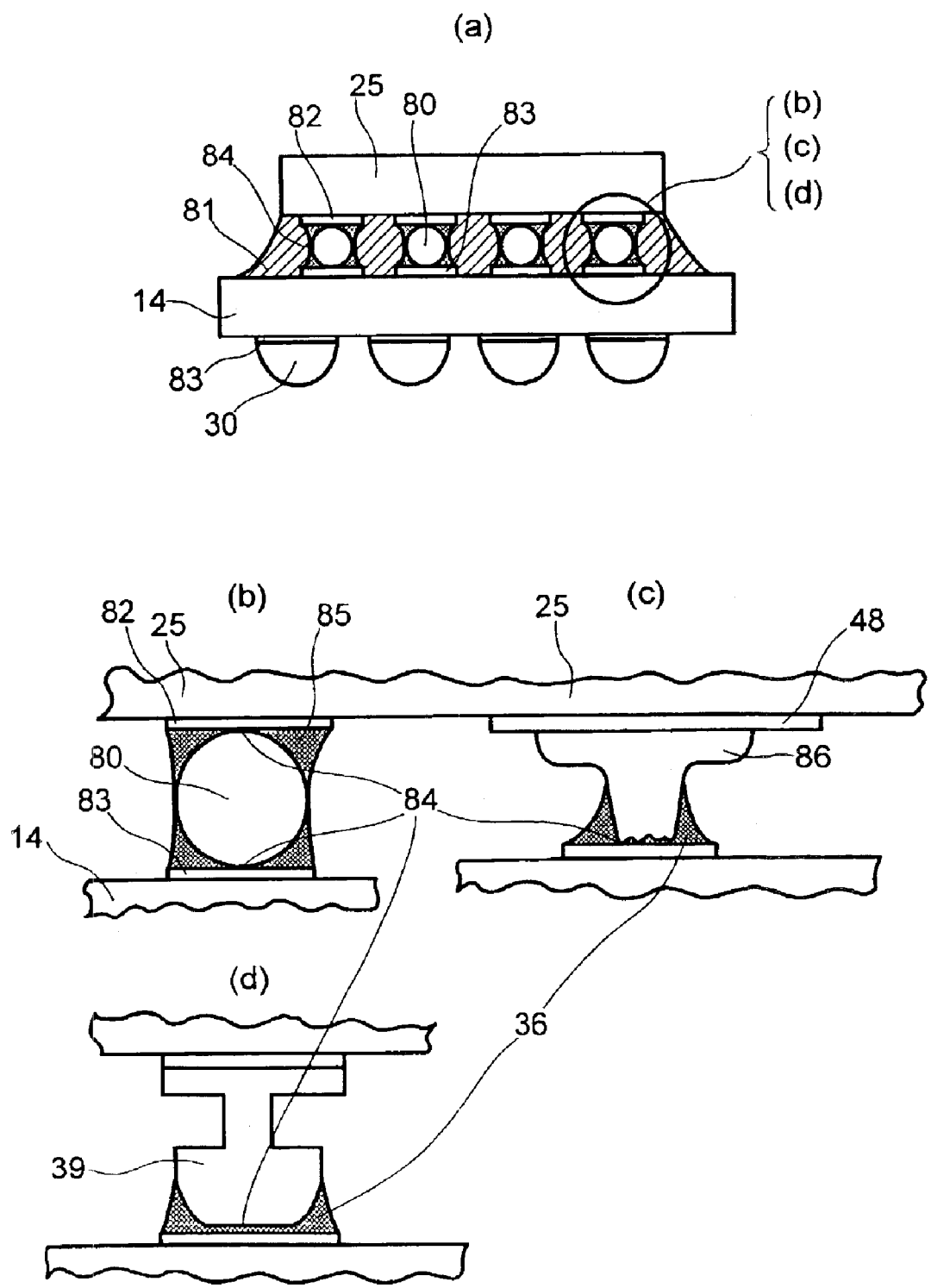
FIG. 16(a) to FIG. 16(d) are cross-sectional views of a model of CSP junctions obtained by the bonding of composite balls.

FIG. 16($a$) to FIG. 16($d$) show, with respect to examples of BGA and CSP, a package of a chip 25 and a junction substrate 14, the package being obtained by temperature-hierarchical bonding of Pb-free solder using Cu balls 80 capable of maintaining strength even at 270 degrees centigrade. Conventionally, the temperature-hierarchical bonding has been performed using high melting Pb-(5–10)Sn solders for bonding a chip and a ceramic junction substrate. However, when the Pb-free solders are to be used, there is no means that replaces the conventional one. Therefore, there is provided such a structure in which, using a Sn-base solder and a compound formed there from, a bonded portion is not melted at the time of the reflow to thereby maintain a bonding strength even when the portion of the solder is melted. FIG. 16($a$) shows a cross-sectional model of BGA/CSP, in which as an organic substrate, a built-up substrate is used as junction substrate 14, although any of a built-up substrate, metal-core substrate, ceramic substrate, and the like, can be considered. As regards the shape of bumps, there are a ball bump (FIG. 16($b$)), a wire bond bump (FIG. 16($c$)) and a Cu-plated bump of a readily deformable structure (FIG. 16($d$)). The external connection terminals are Cu pads or Sn—Ag—Cu-base solder portions 30 formed on Ni/Au-plating portions 83 in the form of balls or paste.

In the example shown in FIG. 16($a$), it becomes possible to obtain bonding capable of withstanding reflow by the steps of feeding Sn onto a thin-film pads 82 on the side of Si chip 25 by means of vapor deposition, plating, a paste, or the composite paste including metal balls and solder balls; thermally pressure-bonding thereto metal balls 80, such as balls of Cu, Ag, Au, Au-plated Al balls, or metallized organic resin balls to thereby form an intermetallic compound with Sn at contact portions 84 in contact with the thin-film pad material (Cu, Ni, Ag, etc.) or in the vicinity of this contact portion. Next, the ball pads 83 formed on the above chip are positioned on the pads of a junction substrate (an $Al_2O_3$, AlN, an organic, a built-up substrate or a metal-core substrate) 14, to which pads a paste comprising metal balls, a solder (Sn, Sn—Ag, Sn—Ag—Cu, Sn—Cu, or the like, or those containing at least one of In, Bi and Zn) and balls is supplied beforehand, and is thermally pressure-bonded, whereby similarly, a metal compound of pads 83 of the junction-substrate and Sn is formed to thereby make it possible to provide a structure capable of withstanding 280 degrees centigrade. Even when the bump height differs, the difference is compensated for by the composite paste. Thus, it becomes possible to obtain a BGA or CSP of high reliability in which stress burden to each of the solder bumps and to the Si chip pads is small with the result that the service life of the bumps is increased and in which, for mechanical protection against the impact of a fall the filling is formed with a solvent-free resin 81 superior in fluidity and having Young's modulus in the range of 50 to 15000 Mpa and a coefficient of thermal expansion of 10 to $60 \times 10^{-6}$/degrees centigrade.

The processes of FIG. 16($b$) to FIG. 16($d$) are described below. FIG. 17($a$) to FIG. 17($c$) show a bonding process for bonding Si chip 25 and junction substrate 14, by the system of Cu ball 80 shown in FIG. 16($b$). Although electrode terminals 82 on chip 20 are made of Ti/Pt/Au in this case, the material is not limited to Ti/Pt/Au. During the stage of wafer processing, a Sn plating, a Sn—Ag—Cu-base solder, or a composite paste 85 containing metal balls and solder balls is fed to thin-film pads 82 formed on each chip. Au is provided mainly for the prevention of surface oxidation and is thin, not exceeding 0.1 μm. Therefore, Au dissolves in the solder in a solid solution state after melting. Pt—Sn compound layers are present as various compounds such as $Pt_3Sn$ or $PtSn_2$. When the diameter of ball 80 is large, it is desirable to use a printing method capable of supplying a thick solder 85 for fixing the balls. Alternatively, balls which are solder plated beforehand may be used.

FIG. 17($a$) shows a state in which a 150 μm metal ball (Cu ball) 80 is positioned and fixed by a metal-mask guide after the application of flux 4 onto the terminal plated with Sn 23.

To ensure that all balls on the wafer or chip come into positive contact with the central part of thin-film pads 82, melting under pressure is performed at 290 degrees centigrade for 5 seconds by means of a flat pulse-current resistance heating body or the like. Due to size variations of Cu balls 80 on the chip, some balls do not come into contact with the pad portions. However, when these balls are close to the pad portions, the possibility of the forming of an alloy layer is high, depending on the plastic deformation of Cu at high temperatures. Even if a few bumps are in contact with the pad portions through a Sn layer without formation of the alloy layer, there is no problem because the majority of the bumps form the alloy layer. In the case of composite paste, even when Cu ball 80 does not come into contact with the pad portion, the pad portions are connected to the Cu ball by the alloy layer formed after bonding; thus, the strength is ensured even at high temperatures.

A cross section of the electrode portion after melting is shown in FIG. 17(*b*). The Cu ball comes into contact with the terminal, and a contact portion 84 is bonded by compounds of Pt—Sn and Cu—Sn. Even when the contact portions are not completely bonded by the compounds, in succeeding steps the alloy layer develops because of heating, pressurization, or the like, with the result that bonding is achieved. Although Sn fillets are formed in the peripheral area, often Sn does not wet sufficiently to spread over the whole Cu surface. After bonding of the ball, each wafer of each chip (a wafer having been cut for each chip) is cleaned; the back side of the chip is then attracted by means of the pulse-current resistance heating body; the ball terminal is positioned and fixed to composite paste 36 formed on electrode terminal 83 of a built-up junction substrate 14; and melting under pressure is performed at 290 degrees centigrade for 5 seconds while spraying a nitrogen gas. A flux may be used when no resin-filling is performed in the succeeding step.

FIG. 17(*c*) shows a cross section obtained after completing melting under pressure. From electrode terminal 82 on the chip side (not shown) to electrode terminal 83 (not shown) on the junction substrate side, all of the high-temperature melting metals and intermetallic compounds or the like, are connected to each other in succession so that no exfoliation occurs even in the succeeding reflow step. Due to differences in the height of the ball bumps, some bumps do not come into contact with the pads on the junction substrate. However, because these ball bumps are connected by intermetallic compounds no problem arises even during reflow.

FIG. 16(*c*) shows an example in which a wire bonding terminal (Cr/Ni/Au, etc.) 48 on the Si chip side and a wire bumping terminal 86, or the like, made of Cu, Ag, Au, or the like, are bonded together by thermal pressure bonding (in some cases, an ultrasonic wave may be applied thereto). The feature of the wire bumping terminal lies in its shape deformed by capillaries and its jagged neck portion. Although the height differences in the jagged neck portion are considerable, in some of them, the irregular peaks are flattened during pressurization and, since it is bonded by the mixture paste, no problem arises. Material for the wire bumping terminal can be Au, Ag, Cu, and Al, which wet well with Sn and are soft. In the case of Al, use is limited to solders that wet with Sn and the range of selection is narrow. However, it is possible to use Al. Similar to the example shown in FIG. 16(*b*), since the cleaning of a narrow gap causes difficulties in operation, it is a principle that a non-cleaning process is used. After positioning, it becomes possible to similarly form intermetallic compound made of both Sn and the pad of the junction substrate by thermal pressure bonding while spraying nitrogen gas, and an intermetallic compound 41 of the junction substrate electrode with Sn can be similarly formed, so that a bonding structure capable of withstanding 280 degrees centigrade can be obtained as in FIG. 16(*b*).

The process for producing the structure of FIG. 16(*d*) is shown in FIGS. 18(*a*) and 18(*b*). The process is a system in which, in wafer processing, relocation is carried out by a Cu terminal 87, a polyimide insulating film 90, or the like, on a semiconductor device of Si chip 25 (not shown) and in which bumps are then formed by Cu plating 88. Using a photoresist 89 and Cu-plating technology, a Cu-plated bump structure 91 is produced that is not a simple bump but has a thin neck portion readily deformable under stress in a plane direction. FIG. 18(*a*) is a cross-sectional view of an example formed in the wafer process, in which, in order to ensure that no stress concentration occurs on the relocated terminal, a readily deformable structure is formed using photoresist 89 and plating, and thereafter the photoresist is removed so that a Cu bump may be formed. FIG. 18(*b*) shows the cross section of a bonding portion formed between Cu bump 91 and the Cu terminal through intermetallic compound of Cu6Sn5 by the steps of coating junction substrate 14 with a composite paste of Cu and Sn, positioning Cu bump 91 of the chip, and pressurizing and heating it (at 290 degrees centigrade for 5 seconds) in a nitrogen atmosphere without using a flux.

(Embodiment 16)

Next, to examine an appropriate range of the ratio of the metal balls included in the solder paste (Cu was selected as a representative component) to solder balls (Sn was selected as a representative component), the weight ratio of Sn to Cu (Sn was selected as a representative component), the weight ratio of Sn to Cu (Sn/Cu) was varied. The results are shown in FIG. 19. As regards the method of evaluation, the cross section of a bonding portion after reflow is observed and appropriate amounts of the mixed components are examined from the states of the contact and/or the approach of Cu particles and the like. The flux used here is a usual non-cleaning type. Relatively large particles of Cu and Sn, 20 to 40 $\mu$m, are used. As a result, it was found that the Sn/Cu ratio range is preferably in the range of 0.6:1.4, and more preferably 0.8:1.0. Unless the particle size is 50 $\mu$m or less, maximum, it is impossible to adapt to the fine design (with respect to the pitch, the diameter of each of the terminals, and the space between), and a level of 20 to 30 $\mu$m is readily used. Fine particles of 5 to 10 $\mu$m are also used as a particle size that provide a margin with respect to the above fine design. However, in the case of an excessively fine size, since the surface area increases and since the reducing capability of the flux is limited, there arise such problems that solder balls remain and that the characteristic of the softness of Sn is lost due to the acceleration of the Cu—Sn alloying. The solder (Sn) does not relate to particle size because it eventually melts. However, it is necessary that in a paste state, the Cu balls and Sn solder balls are uniformly dispersed, so that it is essential to make the particle size of the two balls the same level. Further, it is necessary to plate the surfaces of the Cu particles with Sn to a coating thickness of about 1 $\mu$m so that the solder becomes wettable. This reduces the burden on the flux.

To reduce the rigidity of the composite solder, it is effective to disperse among the metal and solder balls soft, metallized plastic balls. In particular, in the case of a hard metal, this is effective in improving reliability because the soft plastic balls act to reduce the deformation and thermal impact. Similarly, by dispersing substances of low thermal expansion, such as Invar, silica, AlN and SiC, which are metallized in the composite solder, stresses in the joint can be reduced, so that high reliability can be expected. Here, the alloy is noted as a new material that can lower the melting points rather than affecting mechanical properties thereof. Although the alloy is, in general, a hard material, this property of the alloy can be improved by dispersing soft metal balls such as metallized Al, the plastic balls, or the like.

Although the invention has been explained in conjunction with the embodiments, the present invention is not limited to the above-mentioned embodiments and various modifications can be made without departing from the scope of the present invention.

To recapitulate the typical examples of the present invention in view of the aspects disclosed in the above-mentioned embodiments, they are as follows.

(1) In an electronic device comprising electronic parts and a mounting substrate on which the electronic parts are mounted, electrodes of the electronic parts and electrodes of the mounting substrate are connected by solder bonding portions formed of a solder that comprises Sn-base solder balls and metal balls having a melting point higher than the melting point of the Sn-base solder balls, wherein a surface of each metal ball is covered with a Ni layer and the Ni layer is covered with an Au layer.

(2) In the electronic device described in example (1), the metal balls are Cu balls.

(3) In the electronic device described in example (1), the metal balls are Al balls.

(4) In the electronic device described in example (1), the metal balls are Ag balls.

(5) In the electronic device described in example (1), the metal balls are any one selected from a group consisting of Cu alloy balls, Cu—Sn alloy balls, Ni—Sn alloy balls, Zn—Al-base alloy balls, or Au—Sn-base alloy balls.

(6) In the electronic device described in example (1), the metal balls include Cu balls and Cu—Sn alloy balls.

(7) In the electronic device described in any one of the examples (1) to (6), the metal balls have a diameter of 5 $\mu$m to 40 $\mu$m.

(8) In the electronic device described in any one of the examples (1) to (7), in air and at a soldering temperature of $\geq$240 degrees centigrade, the Au layer has the function of preventing oxidation of the metal ball and the Ni layer has the function of preventing diffusion of the Au layer into the metal ball.

(9) In the electronic device described in example (8), the metal balls are Cu balls and the Ni layer has the function of preventing the formation of a Cu3Sn compound that is generated by a reaction between the Cu ball and the Sn-base solder ball.

(10) In the electronic device described in any one of the examples (1) to (6), the Ni layer has a thickness $\geq$0.1 $\mu$m to $\leq$1 $\mu$m.

(11) In the electronic device described in any one of the examples (1) to (6), the Au layer has a thickness $\geq$0.01 $\mu$m to $\geq$0.1 $\mu$m.

(12) In an electronic device that includes semiconductor devices and a mounting substrate on which the semiconductor devices are mounted, wherein electrodes of the semiconductor devices and electrodes of the mounting substrate are connected to each other by bonding portions, each of which is formed by making a solder subjected to a reflow, wherein the solder comprises Sn-base solder balls and metal balls that have a melting point higher than a melting point of the Sn-base solder balls, each metal ball is covered with a Ni layer, the Ni layer is covered with an Au layer, and the metal balls are bonded together by a compound made of the metal and the Sn.

(13) In the electronic device described in the example (12), the metal balls are Cu balls.

(14) In the electronic device described in the example (12), in the bonding portion, the metal balls are bonded together by a compound of the metal and the Sn.

(15) In an electronic device that includes semiconductor devices, a first substrate on which the semiconductor devices are mounted, and a second substrate on which the first substrate is mounted, wherein electrodes of the semiconductor devices and electrodes of the first substrate are connected to each other by bonding portions, each of which is formed by making a solder subjected to a reflow, and wherein the solder comprises Sn-base solder balls and metal balls that have a melting point higher than a melting point of the Sn solder balls, each metal ball is covered with a Ni layer, and the Ni layer is covered with an Au layer, and further, the electrodes of the first substrate and electrodes of the second substrate are connected to each other by bonding portions, each of which is formed of at least any one of a Sn—Ag-base solder, a Sn—Ag—Cu-base solder, a Sn—Cu-base solder and a Sn—Zn-base solder.

(16) In the electronic device described in example (15), the electrodes of the first substrate and the electrodes of the second substrate are bonded to each other by bonding portions made of an Sn-(2.0–3.5) Ag-(0.5–1.0) Cu solder.

(17) In an electronic device that includes semiconductor chips and a mounting substrate on which the semiconductor chips are mounted, wherein bonding terminals of the substrate are connected with bonding terminals that are formed on one side surface of the semiconductor chip by wire bonding, and the other side surface of the semiconductor chip and the substrate are connected to each other by bonding portions, each of which is formed by making a solder subjected to a reflow, wherein the solder comprises Sn-base solder balls and metal balls that have a melting point higher than the melting point of the Sn-base solder balls, each metal ball is covered with a Ni layer, and the Ni layer is covered with an Au layer, and the metal balls are bonded together by a compound made of the metal and the Sn.

(18) In the electronic device described in example (17), the substrate has external bonding terminals on a back surface opposite to a surface of the substrate on which the bonding terminals are formed, and the external bonding terminals are formed of at least any one of a Sn—Ag-base solder, a Sn—Ag—Cu-base solder, a Sn—Cu-base solder, or a Sn—Zn-base solder.

(19) In a method for fabricating an electronic device that includes electronic parts, a first substrate on which the electronic parts are mounted, and a second substrate on which the first substrate is mounted, wherein the method comprises a first step in which electrodes of the electronic parts and electrodes of the first substrate are connected to each other by making a first lead-free solder subjected to a reflow at a temperature $\leq$240 degrees centigrade and $\leq$ a heat resistance temperature of the electronic parts, wherein the first lead-free solder includes Sn-base solder balls and metal balls having a melting point higher than the melting point of the Sn-base solder balls, each metal ball is covered with a Ni layer and the Ni layer is covered with an Au layer; and a second step in which the first substrate on which the electronic parts are mounted and the second substrate are bonded to each other by making a second lead-free solder subjected to a reflow at a temperature lower than the reflow temperature in the first step.

(20) In a method for manufacturing an electronic device described in example (19), the reflow of the first lead-free soldering is performed in air.

(21) In a method for manufacturing an electronic device described in example (19), the reflow of the first lead-free soldering is performed at a temperature ≧270 degrees centigrade to ≦300 degrees centigrade.

(22) In a method for fabricating an electronic device described in example (19), bonding of the first substrate to the second substrate is performed using an Sn—Ag-base solder, an Sn—Ag—Cu-base solder, or a Sn—Zn-base solder as the second lead-free solder.

(23) In a method for fabricating an electronic device described in example (22), bonding of the first substrate to the second substrate is performed using an Sn-(2.0–3.5)Ag-(0.5–1.0)Cu solder as the Sn—Ag—Cu-base solder.

The advantageous effects obtained by the representative essential features of the invention are briefly described below.

According to the invention, it is possible to provide a solder capable of maintaining strength at high temperature in temperature-hierarchical bonding. Particularly, it is possible to provide a solder paste, a solder bonding method and a solder-coupling structure that are made by taking the lead-free solder connection in air into consideration.

Further, according to the invention, it is possible to provide a method of temperature-hierarchical bonding in which a solder capable of maintaining the bonding strength at high temperature is used. Particularly, it is possible to provide temperature-hierarchical bonding that maintains the reliability of bonding at the high-temperature side bonding portion even when soldering is done in air using a lead-free solder material.

Moreover, according to the invention, it is possible to provide an electronic device that has bonding portions capable of maintaining the bonding strength at high temperatures. Particularly, it is possible to provide an electronic device having high reliability of bonding at the high-temperature side bonding portion even when soldering is done in air using a lead-free solder material.

What is claimed is:

1. A solder comprising Sn-base solder balls and metal balls having a melting point higher than a melting point of the Sn-base solder balls, wherein a surface of each metal ball is covered with at least a Ni layer and a Cu layer and a Au layer, and the Cu layer is interposed between the Ni layer and the Au layer.

2. A solder according to claim 1, wherein the metal balls are Cu balls.

3. A solder according to claim 1, wherein the metal balls are Al balls.

4. A solder according to claim 1, wherein the metal balls are Ag balls.

5. A solder according to claim 1, wherein the metal balls are any one selected from a group consisting of Cu alloy balls, Cu—Sn alloy balls, Ni—Sn alloy balls, Zn—Al-base alloy balls, and Au—Sn-base alloy balls.

6. A solder according to claim 1, wherein the metal balls include Cu balls and Cu—Sn alloy balls.

7. A solder according to claim 1, wherein the metal balls has a diameter of 5 $\mu$m to 40 $\mu$m.

8. A solder according to claim 1, wherein in the air and at a soldering temperature of equal to or more than 240 degree centigrade, the Au layer has a function of preventing the oxidation of the metal ball and the Ni layer has a function of preventing a diffusion of the Au layer into the metal ball.

9. A solder according to claim 8, wherein the metal balls are Cu balls and the Ni layer has a function of preventing the formation of a Cu3Sn compound which is generated by a reaction between the Cu ball and the Sn ball.

10. A solder according to claim 1, wherein the Ni layer has a thickness of equal to or more than 0.1 $\mu$m to equal to or less than 1 $\mu$m.

11. A solder according to claim 1, wherein the Au layer has a thickness of equal to or more than 0.01 $\mu$m to equal to or less than 0.1 $\mu$m.

12. A solder according to claim 1, wherein the Sn-base solder ball forms an oxidation prevention film on a surface thereof.

13. A solder according to claim 1, wherein a ratio between the Sn-base solder balls and the metal balls is set to 0.6 to 1.4.

14. A solder according to claim 1, wherein the solder includes a rosin-base flux.

15. A solder according to claim 1, wherein the melting point of the Sn-base solder is lower than a melting point of an Sn—Ag—Cu-base solder and the melting point of the metal ball is higher than the melting point of the Sn—Ag—Cu-base solder.

16. A solder according to claim 1, wherein the solder is served for a high-temperature side solder bonding in a temperature hierarchical bonding which mounts electric parts using a lead-free solder material at different temperatures.

17. A solder according to claim 16, wherein the solder is capable of being used in a solder bonding which is performed in the air and at a temperature of equal to or more than 240 degree centigrade.

18. A solder comprising Cu balls and Sn-base solder balls, wherein a Ni layer is formed on each Cu ball, an Cu layer is formed on the Ni layer, an Au layer is formed on the Cu layer, the solder forms compounds which contain Cu6Sn5 from portions of the Cu balls and the Sn-base solder balls at a temperature equal to or more than a melting point of the Sn, and the Cu balls are bonded together by the compounds which contain the Cu6Sn5.

19. A solder comprising Cu balls and Sn-base solder balls, wherein a Ni layer is formed on each Cu ball, an Cu layer is formed on the Ni layer, an Au layer is formed on the Cu layer, the Sn-base solder fills gaps between the Cu balls when the Sn-base solder bails melt and compounds which contain Cu6Sn5 are formed at least portions of surfaces of the Cu balls, and the Cu balls are bonded together by the compounds which contain the Cu6Sn5.

20. A solder according to claim 18, wherein a diameter of the Cu balls is 5 m to 40 $\mu$m.

21. A solder according to claim 18, wherein the Au layers have a function of preventing the oxidation of the metal balls in the air and at a temperature of equal to or more than 240 degree centigrade, and the Ni layers have a function of preventing the diffusion of the Au layer into the metal balls.

22. A solder according to claim 18, wherein the Ni layers have a thickness of equal to or more than 0.1 $\mu$m to equal to or less than 1 $\mu$m.

23. A solder according to claim 18, wherein the Au layers have a thickness of equal to or more than 0.01 $\mu$m to equal to or less than 0.1 $\mu$m.

24. A solder according to claim 1, wherein another Ni layer is interposed between the Cu layer and the Au layer.

25. A solder according to claim 18, wherein another Ni layer is interposed between the Cu layer and the Au layer.

26. A solder according to claim 19, wherein another Ni layer is interposed between the Cu layer and the Au layer.

* * * * *